United States Patent [19]
Zenno et al.

[11] Patent Number: 5,577,079
[45] Date of Patent: Nov. 19, 1996

[54] PHASE COMPARING CIRCUIT AND PLL CIRCUIT

[75] Inventors: Yoiti Zenno; Seiji Higurashi, both of Tokyo, Japan

[73] Assignee: Victor Company of Japan, Ltd., Yokohama, Japan

[21] Appl. No.: 504,470

[22] Filed: Jul. 20, 1995

[30] Foreign Application Priority Data

Jul. 28, 1994 [JP] Japan .................................. 6-196106
Jul. 29, 1994 [JP] Japan .................................. 6-197260

[51] Int. Cl.⁶ .................................................. H03D 3/24
[52] U.S. Cl. .......................... 375/373; 375/374; 375/376;
327/3; 327/7; 327/12; 331/11; 331/25
[58] Field of Search ............................... 375/373–376,
375/286, 293, 294; 327/1–7, 12, 144–148,
155–159, 162–163; 331/11, 18, 25

[56] References Cited

U.S. PATENT DOCUMENTS 4,280,099  7/1981  Rattlingourd .
4,977,461  12/1990  Ichimura .

FOREIGN PATENT DOCUMENTS 0502739   9/1992  European Pat. Off. .
0530776   3/1993  European Pat. Off. .
60-121824 6/1985  Japan .
2-156475  6/1990  Japan .
3-16337   1/1991  Japan .
4-60905   2/1992  Japan .

*Primary Examiner*—Stephen Chin
*Assistant Examiner*—Thuy L. Nguyen
*Attorney, Agent, or Firm*—Pollock, Vande Sande & Priddy

[57] ABSTRACT

A phase comparing circuit includes a first device for generating a detection signal in response to a multi-level signal. The detection signal represents whether or not the multi-level signal is in a given level. A second device connected to the first device is operative for generating a first control signal in response to the detection signal generated by the first device and a clock signal. The first control signal represents a time interval between a leading edge of a pulse in the detection signal and a strobe point of the clock signal which immediately follows the leading edge of the pulse in the detection signal. A third device connected to the first device is operative for generating a second control signal in response to the detection signal generated by the first device and the clock signal. The second control signal represents a time interval between the strobe point of the clock signal and a trailing edge of the pulse in the detection signal. A fourth device connected to the second device and the third device for generating a phase error signal in response to the first control signal generated by the second device and the second control signal generated by the third device. The phase error signal represents a difference between a phase of the detection signal generated by the first device and a phase of the clock signal.

20 Claims, 14 Drawing Sheets

PHASE COMPARING CIRCUIT AND PLL CIRCUIT

BACKGROUND OF THE INVENTION

1. Field of the Invention

This invention relates to a phase comparing circuit and a PLL (phase locked loop) circuit.

2. Description of the Prior Art

Some electronic apparatuses such as VTR's (video tape recorders), disk players, and communication equipments include a device for generating a clock signal from a reproduced or received information signal. The generated clock signal is used for timing control related to the detection of data in the information signal. It is well-known to use a PLL (phase locked loop) circuit in such a clock-signal generating device.

A reproducing side of a PCM-VTR conforming to Partial Response Class 4 includes a waveform equalizer which removes inter-symbol interference components from a reproduced information signal. The waveform equalizer processes the reproduced information signal into a 3-level information signal substantially free from inter-symbol interference. The waveform equalizer is followed by a partial response detector and a clock-signal generating circuit which are parallel to each other. The partial response detector converts the 3-level information signal into a bi-level information signal (a binary information signal or a digital information signal). The clock-signal generating circuit recovers or generates a clock signal from the 3-level information signal. A D-flip-flop following the partial response detector and the clock-signal generating circuit samples and holds the bi-level information signal at a timing determined by the generated clock signal. The sapling and holding process results in the extraction or recovery of original data (information) from the bi-level information signal.

In the reproducing side of the above-indicated PCM-VTR, there are two different signal transmission paths between the waveform equalizer and the D-flip-flop. One of the signal transmission paths includes the partial response detector, while the other signal transmission path includes the clock-signal generating circuit. Since the signal transmission paths differ from each other, there is a difference between the phases of signals appearing at the output ends of the signal transmission paths. To compensate for such a phase difference, a signal delay device is interposed in one of the signal transmission paths.

During a playback process, a variation in the reproducing speed causes a change in the data rate (the data transmission rate) related to the reproduced information signal. In the reproducing side of the above-indicated PCM-VTR, it tends to be difficult to maintain suitable compensation for the phase difference when the data rate related to the reproduced information signal changes.

SUMMARY OF THE INVENTION

It is an object of this invention to provide an improved PLL circuit.

It is another object of this invention to provide an improved phase comparing circuit usable in a PLL device.

A first aspect of this invention provides a phase comparing circuit comprising first means for generating a detection signal in response to a multi-level signal, the detection signal representing whether or not the multi-level signal is in a given level; second means connected to the first means for generating a first control signal in response to the detection signal generated by the first means and a clock signal, the first control signal representing a time interval between a leading edge of a pulse in the detection signal and a strobe point of the clock signal which immediately follows the leading edge of the pulse in the detection signal; third means connected to the first means for generating a second control signal in response to the detection signal generated by the first means and the clock signal, the second control signal representing a time interval between the strobe point of the clock signal and a trailing edge of the pulse in the detection signal; and fourth means connected to the second means and the third means for generating a phase error signal in response to the first control signal generated by the second means and the second control signal generated by the third means, the phase error signal representing a difference between a phase of the detection signal generated by the first means and a phase of the clock signal.

A second aspect of this invention provides a phase comparing circuit comprising first means for generating a detection signal in response to a multi-level signal, the detection signal representing whether or not the multi-level signal is in a given level; second means connected to the first means for generating a first control signal in response to the detection signal generated by the first means and a clock signal, the first control signal representing a time interval between a leading edge of a pulse in the detection signal and a first strobe point of the clock signal which immediately follows the leading edge of the pulse in the detection signal; third means for generating a second control signal in response to the clock signal, the second control signal representing a time interval between the first strobe point of the clock signal and a second strobe point of the clock signal which immediately follows the first strobe point of the clock signal; fourth means for generating a third control signal in response to the clock signal, the third control signal representing a time interval being equal to a half of a period of the clock signal and starting from the second strobe point of the clock signal; and fifth means connected to the second means, the third means, and the fourth means for generating a phase error signal in response to the first control signal generated by the second means, the second control signal generated by the third means, and the third control signal generated by the fourth means, the phase error signal representing a difference between a phase of the detection signal generated by the first means and a phase of the clock signal.

A third aspect of this invention provides a phase comparing circuit comprising first means for generating a detection signal in response to a multi-level signal, the detection signal representing whether or not the multi-level signal is in a given level; second means connected to the first means for generating a first control signal in response to the detection signal generated by the first means and a clock signal, the first control signal representing a time interval between a leading edge of a pulse in the detection signal and a first strobe point of the clock signal which immediately follows the leading edge of the pulse in the detection signal; third means connected to the first means for generating a second control signal in response to the detection signal generated by the first means and the clock signal in cases where a trailing edge of the pulse in the detection signal precedes a second strobe point of the clock signal which immediately follows the first strobe point of the clock signal, and for generating a third control signal and a fourth control signal in response to the clock signal in cases where the second strobe point of the clock signal precedes the trailing edge of the pulse in the detection signal, the second control signal representing a time interval between the first strobe point of the clock signal and the trailing edge of the pulse in the detection signal, the third control signal representing a time interval between the first strobe point of the clock signal and the second strobe point of the clock signal, the fourth control signal representing a time interval equal to a half of a period of the clock signal which starts from the second strobe point of the clock signal; and fourth means connected to the second means and the third means for generating a phase error signal in response to the first control signal generated by the second means and the second control signal generated by the third means or in response to the first control signal generated by the second means and the third and fourth control signals generated by the third means, the phase error signal representing a difference between a phase of the detection signal generated by the first means and a phase of the clock signal.

A fourth aspect of this invention provides a phase comparing circuit comprising a) a plurality of signal detectors generating different detection signals in response to a multi-level signal respectively, the detection signals representing whether or not the multi-level signal is in different given levels respectively; and b) a plurality of phase comparing sections following the signal detectors respectively and processing the detection signals generated by the signal detectors respectively; wherein each of the phase comparing sections comprises b1) first means for generating a first control signal in response to the related detection signal, the first control signal representing a time interval between a leading edge of a pulse in the detection signal and a strobe point of a clock signal which immediately follows the leading edge of the pulse in the detection signal; b2) second means for generating a second control signal in response to the related detection signal, the second control signal representing a time interval between the strobe point of the clock signal and a trailing edge of the pulse in the detection signal; and b3) third means connected to the first means and the second means for generating a phase error signal in response to the first control signal generated by the first means and the second control signal generated by the second means, the phase error signal representing a difference between a phase of the detection signal generated by the first means and a phase of the clock signal.

A fifth aspect of this invention is based on the first aspect thereof, and provides a phase comparing circuit wherein the fourth means comprises a charge pump circuit.

A sixth aspect of this invention provides a PLL circuit comprising first means for generating a clock signal; second means connected to the first means for generating a first control signal in response to an input signal and the clock signal generated by the first means, the first control signal representing a time interval between a leading edge of a pulse in the input signal and a strobe point of the clock signal which immediately follows the leading edge of the pulse in the input signal; third means connected to the first means for generating a second control signal in response to the clock signal generated by the first means and the input signal, the second control signal representing a time interval between the strobe point of the clock signal and a trailing edge of the pulse in the input signal; fourth means connected to the second means and the third means for generating a phase error signal in response to the first control signal generated by the second means and the second control signal generated by the third means, the phase error signal representing a difference between a phase of the clock signal generated by the first means and a phase of the input signal; and fifth means for controlling the phase of the clock signal in response to the phase error signal generated by the fourth means.

A seventh aspect of this invention provides a phase comparing circuit comprising first means for generating a detection signal in response to a multi-level signal, the detection signal representing whether or not the multi-level signal is in a given level; second means connected to the first means for generating a first control signal in response to the detection signal generated by the first means and a clock signal, the first control signal representing a time interval between a leading edge of a pulse in the detection signal and a first strobe point of the clock signal which immediately follows the leading edge of the pulse in the detection signal; third means connected to the first means for generating a second control signal in response to the detection signal generated by the first means and the clock signal in cases where a trailing edge of the pulse in the detection signal precedes a second strobe point of the clock signal which immediately follows the first strobe point of the clock signal, and for generating a third control signal and a fourth control signal in response to the detection signal generated by the first means and the clock signal in cases where the second strobe point of the clock signal precedes the trailing edge of the pulse in the detection signal, the second control signal representing a time interval between the first strobe point of the clock signal and the trailing edge of the pulse in the detection signal, the third control signal representing a time interval between the first strobe point of the clock signal and the second strobe point of the clock signal, the fourth control signal representing a time interval between the trailing edge of the pulse in the detection signal and a third strobe point of the clock signal which immediately follows the trailing edge of the pulse in the detection signal; and fourth means connected to the second means and the third means for generating a phase error signal in response to the first control signal generated by the second means and one of (1) the second control signal generated by the third means and (2) a combination of the third and fourth control signals generated by the third means, the phase error signal representing a difference between a phase of the detection signal generated by the first means and a phase of the clock signal.

An eighth aspect of this invention provides a phase comparing circuit comprising first means for generating a detection signal in response to a multi-level signal, the detection signal representing whether or not the multi-level signal is in a given level; second means connected to the first means for generating a first control signal in response to the detection signal generated by the first means and a clock signal, the first control signal representing a time interval between a leading edge of a pulse in the detection signal and a first strobe point of the clock signal which immediately follows the leading edge of the pulse in the detection signal; third means connected to the first means for generating a second control signal in response to the detection signal generated by the first means and the clock signal, the second control signal representing a time interval between a trailing edge of the pulse in the detection signal and a second strobe point of the clock signal which immediately follows the trailing edge of the pulse in the detection signal; fourth means for generating a third control signal in response to the clock signal, the third control signal representing a time interval equal to a period of the clock signal; and fifth means connected to the second means, the third means, and the fourth means for generating a phase error signal in response to the first control signal generated by the second means, the second control signal generated by the third means, and the third control signal generated by the fourth means, the phase error signal representing a difference between a phase of the detection signal generated by the first means and a phase of the clock signal.

A ninth aspect of this invention is based on the second aspect thereof, and provides a phase comparing circuit wherein the first means comprises a plurality of signal detectors generating different detection signals in response to the multi-level signal respectively, the detection signals representing whether or not the multi-level signal is in different given levels respectively, and wherein the second means is responsive to the detection signals generated by the signal detectors.

A tenth aspect of this invention is based on the third aspect thereof, and provides a phase comparing circuit wherein the first means comprises a plurality of signal detectors generating different detection signals in response to the multi-level signal respectively, the detection signals representing whether or not the multi-level signal is in different given levels respectively, and wherein the second means and the third means are responsive to the detection signals generated by the signal detectors.

An eleventh aspect of this invention is based on the seventh aspect thereof, and provides a phase comparing circuit wherein the first means comprises a plurality of signal detectors generating different detection signals in response to the multi-level signal respectively, the detection signals representing whether or not the multi-level signal is in different given levels respectively, and wherein the second means and the third means are responsive to the detection signals generated by the signal detectors.

A twelfth aspect of this invention is based on the eighth aspect thereof, and provides a phase comparing circuit wherein the first means comprises a plurality of signal detectors generating different detection signals in response to the multi-level signal respectively, the detection signals representing whether or not the multi-level signal is in different given level respectively, and wherein the second means and the third means are responsive to the detection signals generated by the signal detectors.

A thirteenth aspect of this invention is based on the second aspect thereof, and provides a phase comparing circuit wherein the fifth means comprises a charge pump circuit.

A fourteenth aspect of this invention is based on the third aspect thereof, and provides a phase comparing circuit wherein the fourth means comprises a charge pump circuit.

A fifteenth aspect of this invention is based on the seventh aspect thereof, and provides a phase comparing circuit wherein the fourth means comprises a charge pump circuit.

A sixteenth aspect of this invention is based on the eighth aspect of this invention, and provides a phase comparing circuit wherein the fifth means comprises a charge pump circuit.

A seventeenth aspect of this invention provides a PLL circuit comprising the phase comparing circuit according to the second aspect thereof.

An eighteenth aspect of this invention provides a PLL circuit comprising the phase comparing circuit according to the third aspect thereof.

A nineteenth aspect of this invention provides a PLL circuit comprising the phase comparing circuit according to the second aspect thereof.

A twentieth aspect of this invention provides a PLL circuit comprising the phase comparing circuit according to the eighth aspect thereof.

DESCRIPTION OF THE PREFERRED EMBODIMENTS

First Embodiment

Figure 1:
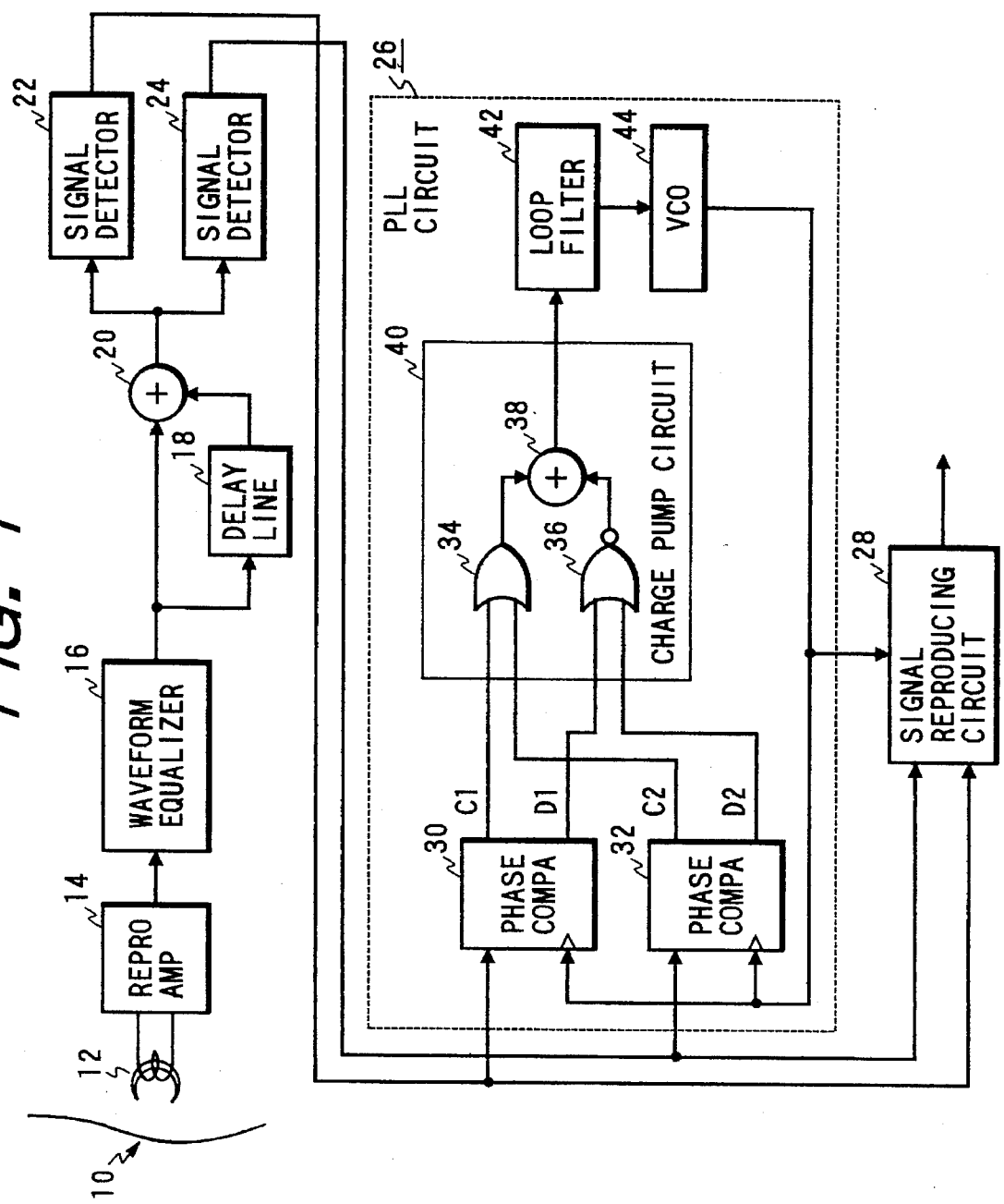
FIG. 1 is a block diagram of an information reproducing apparatus including a PLL circuit and phase comparators according to a first embodiment of this invention.

FIG. 1 shows an apparatus according to a first embodiment of this invention. With reference to FIG. 1, an information signal conforming to Partial Response Class 4 (PR 4) can be read out from a magnetic tape 10 by a reproducing head 12. The reproducing head 12 is sequentially followed by a reproducing amplifier 14 and a waveform equalizer 16. The output side of the waveform equalizer 16 is connected to the input end of a delay line (a delay device) 18. The output side of the waveform equalizer 16 is also connected to a first input terminal of an analog adder 20. The output end of the delay line 18 leads to a second input terminal of the analog adder 20. The output terminal of the analog adder 20 is connected to the input terminals of signal detectors 22 and 24 which are followed by a PLL circuit 26 and a signal reproducing circuit 28.

The PLL circuit 26 includes phase comparators 30 and 32, a charge pump circuit 40, a loop filter 42, and a VCO (a voltage controlled oscillator) 44. The charge pump circuit 40 has an OR gate 34, a NOR gate 36, and an integrator (an analog adder) 38. First input terminals of the phase comparators 30 and 32 are connected to the output terminals of the signal detectors 22 and 24 respectively. Second input terminals of the phase comparators 30 and 32 are connected in common to the output terminal of the VCO 44. The phase comparator 30 has an output terminal for a charge signal C1 which is connected to a first input terminal of the OR gate 34. Also, the phase comparator 30 has an output terminal for a discharge signal D1 which is connected to a first input terminal of the NOR gate 36. The phase comparator 32 has an output terminal for a charge signal C2 which is connected to a second input terminal of the OR gate 34. Also, the phase comparator 32 has an output terminal for a discharge signal D2 which is connected to a second input terminal of the NOR gate 36. The output terminal of the OR gate 34 leads to a first input terminal of the integrator 38. The output terminal of the NOR gate 36 leads to a second input terminal of the integrator 38. The output terminal of the integrator 38 is connected to the input terminal of the loop filter 42. The output terminal of the loop filter 42 leads to the control terminal of the VCO 44. The output terminal of the VCO 44 is connected to a clock input terminal of the signal reproducing circuit 28. As will be made clear later, the VCO 44 outputs a reproduced clock signal.

The reproducing amplifier 14 outputs a reproduced information signal which is transmitted via the waveform equalizer 16 and the delay line 18 to the analog adder 20. The delay line 18 serves to delay the output signal of the waveform equalizer 16 by a time equal to a clock period (the period of a clock signal) T. The analog adder 20 sums or adds the output signals of the waveform equalizer 16 and the delay line 18. The addition-resultant signal, that is, the output signal of the analog adder 20, assumes one of three different levels at every information-transmission time point. Thus, the output signal of the analog adder 20 is changeable among the three different levels.

Figure 2:
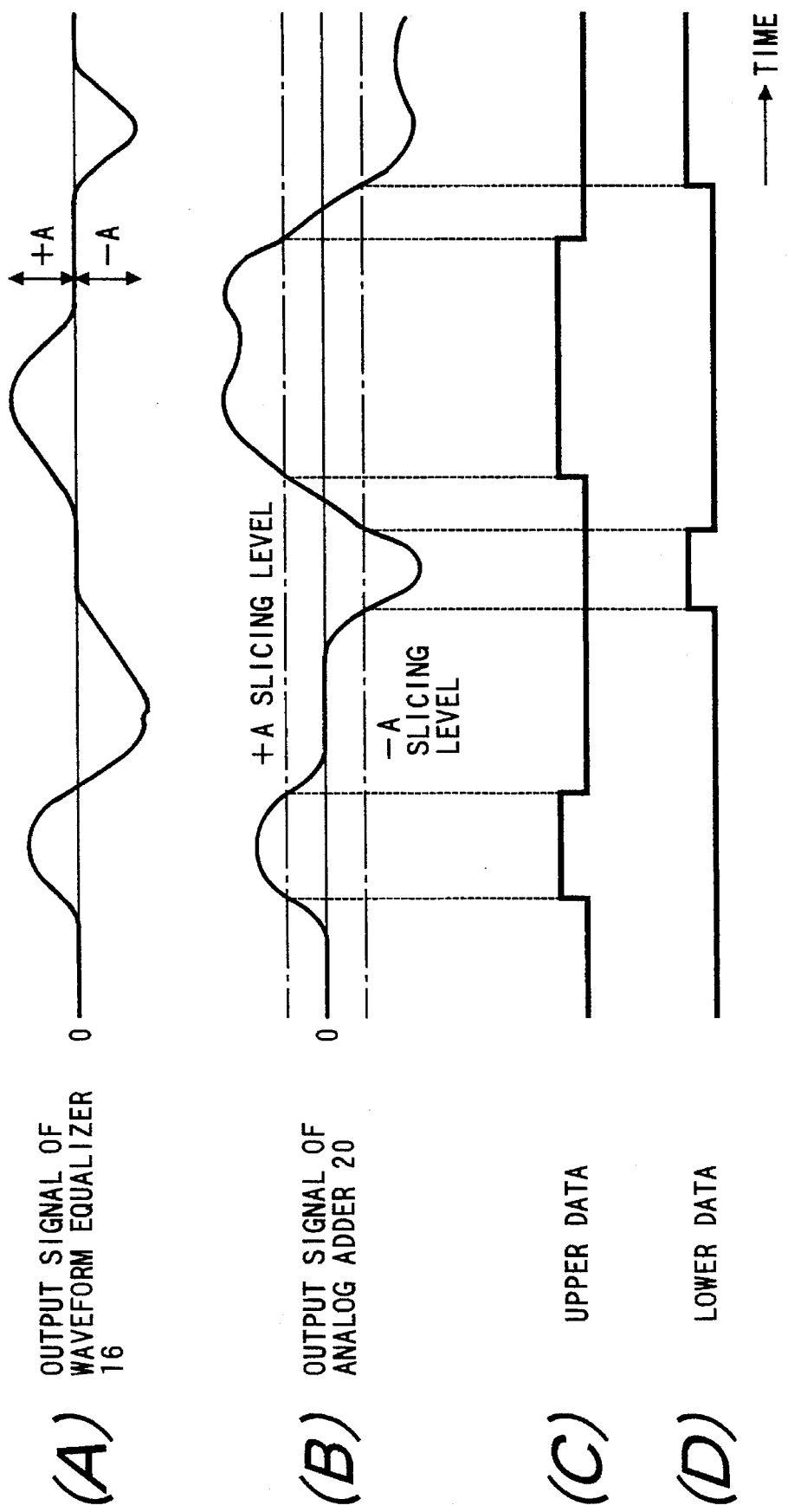
FIG. 2 is a time-domain diagram of signals in the apparatus of FIG. 1.

It is now assumed that the output signal of the waveform equalizer 16 has a waveform such as shown in the portion (A) of FIG. 2. In this case, the output signal of the analog adder 20 constitutes a 3-level signal as shown in the portion (B) of FIG. 2. Specifically, the output signal of the analog adder 20 is changeable among three different levels "+A", "0", and "−A". A recording side (not shown) executes pre-coding of an information signal to be recorded on the magnetic tape 10. The pre-coding is designed so that the levels "+A" and "−A" of the output signal of the analog adder 20 correspond to a logic value of "H" in a binary digital signal while the level "0" thereof corresponds to a logic value of "L" in the binary digital signal. It should be noted that the logic values of "H" and "L" agree with logic states of "1" and "0" respectively.

The signal detectors 22 and 24 receives the output signal of the analog adder 20. The signal detector 22 serves to sense the level "+A" of the output signal of the analog adder 20. The signal detector 24 serves to sense the level "−A" of the output signal of the analog adder 20. Specifically, the signal detector 22 includes a comparator which compares the output signal of the analog adder 20 with a predetermined slicing level corresponding to the level "+A" (see the portion (B) of FIG. 2). The comparator in the signal detector 22 outputs upper data which has a waveform such as shown in the portion (C) of FIG. 2. The signal detector 24 includes a comparator which compares the output signal of the analog adder 20 with a predetermined slicing level corresponding to the level "−A" (see the portion (B) of FIG. 2). The comparator in the signal detector 24 outputs lower data which has a waveform such as shown in the portion (D) of FIG. 2.

The phase comparators 30 and 32 in the PLL circuit 26 are similar to each other. The phase comparators 30 and 32 receive the upper data and the lower data from the signal detectors 22 and 24 respectively.

Figure 3:
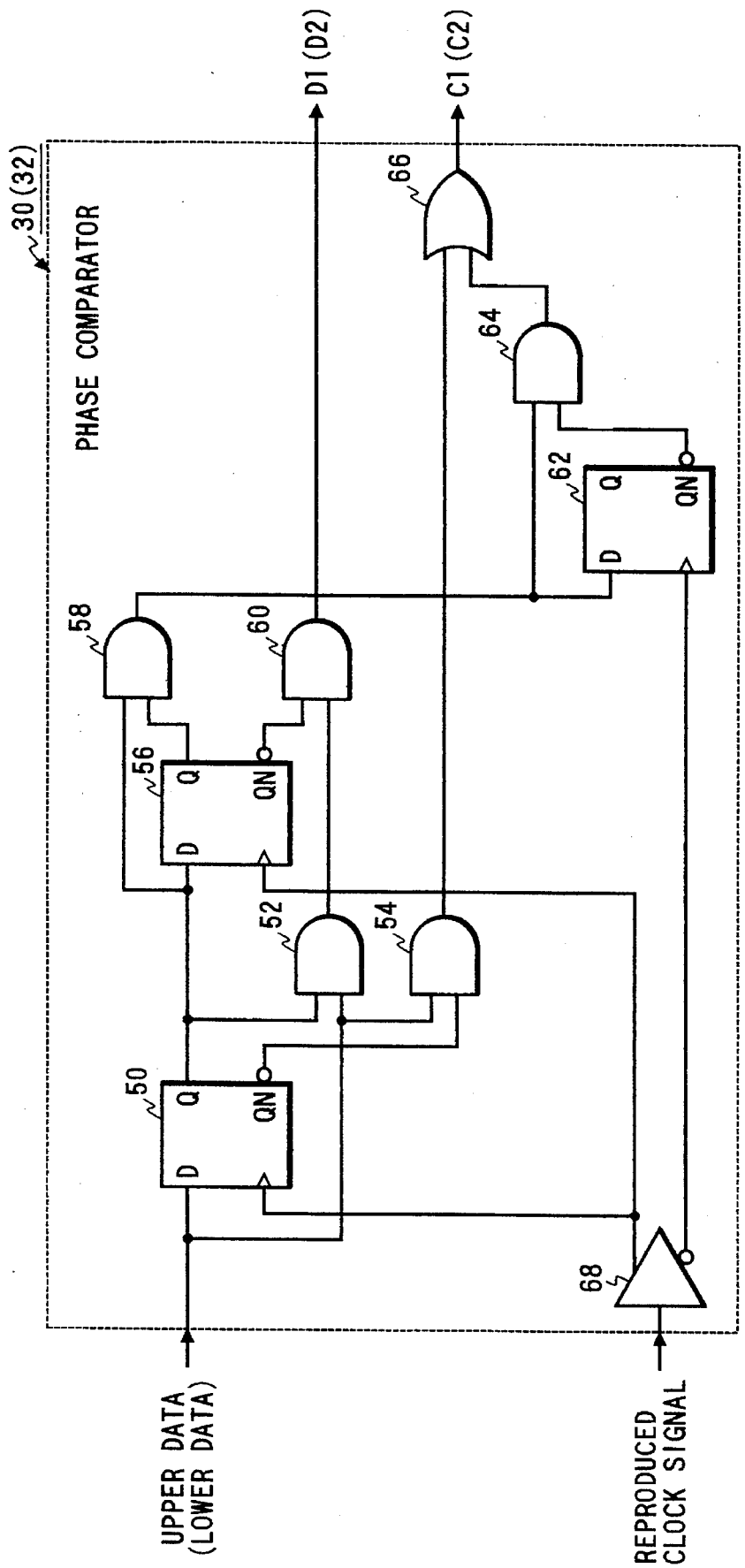
FIG. 3 is a block diagram of a phase comparator in the apparatus of FIG. 1.

As shown in FIG. 3, the phase comparator 30 (or the phase comparator 32) includes D-flip-flops 50, 56, and 62, AND gates 52, 54, 58, 60, and 64, an OR gate 66, and a buffer 68. The upper data outputted from the signal detector 22 (or the lower data outputted from the signal detector 24) is applied to the D input terminal of the D-flip-flop 50 and first input terminals of the AND gates 52 and 54. The non-inverting output terminal Q of the D-flip-flop 50 is connected to a second input terminal of the AND gate 52, the D input terminal of the D-flip-flop 56, and a first input terminal of the AND gate 58. The inverting output terminal QN of the D-flip-flop 50 is connected to a second input terminal of the AND gate 54. The output terminal of the AND gate 52 leads to a first input terminal of the AND gate 60. The output terminal of the AND gate 54 leads to a first input terminal of the OR gate 66. The non-inverting output terminal Q of the D-flip-flop 56 is connected to a second input terminal of the AND gate 58. The inverting output terminal QN of the D-flip-flop 56 is connected to a second input terminal of the AND gate 60. The AND gate 60 outputs the discharge signal D1 (or D2). The output terminal of the AND gate 58 is connected to the D input terminal of the D-flip-flop 62 and a first input terminal of the AND gate 64. The inverting output terminal QN of the D-flip-flop 62 is connected to a second input terminal of the AND gate 64. The output terminal of the AND gate 64 leads to a second input terminal of the OR gate 66. The OR gate 66 outputs the charge signal C1 (or C2). The input terminal of the buffer 68 receives the reproduced clock signal from the VCO 44. The non-inverting output terminal of the buffer 68 is connected to the clock input terminals of the D-flip-flops 50 and 56. The reproduced clock signal is transmitted to the D-flip-flops 50 and 56 via the buffer 68. The inverting output terminal of the buffer 68 is connected to the clock input terminal of the D-flip-flop 62. An inversion of the reproduced clock signal is fed to the D-flip-flop 62 from the buffer 68.

The phase comparators 30 and 32 are similar in operation. Accordingly, only operation of the phase comparator 30 will now be described. The reproduced clock signal applied to the buffer 68 has a waveform such as shown in the portion (A) of FIG. 4. The upper data fed from the signal detector 22 to the D-flip-flop 50 and the AND gates 52 and 54 has a waveform such as shown in the portion (B) of FIG. 4. The upper data is latched by the D-flip-flop 50 at every strobe point of the reproduced clock signal (that is, at every moment of the occurrence of a rising or positive-going edge in the reproduced clock signal). Thus an output signal of the D-flip-flop 50 which appears at its non-inverting output terminal Q has a waveform such as shown in the portion (C) of FIG. 4. The Q output signal of the D-flip-flop 50 (see the portion (C) of FIG. 4) is latched by the D-flip-flop 56 at every strobe point of the reproduced clock signal (that is, at every moment of the occurrence of a rising or positive-going edge in the reproduced clock signal). Thus, an output signal of the D-flip-flop 56 which appears at its non-inverting output terminal Q has a waveform such as shown in the portion (D) of FIG. 4.

Figure 4:
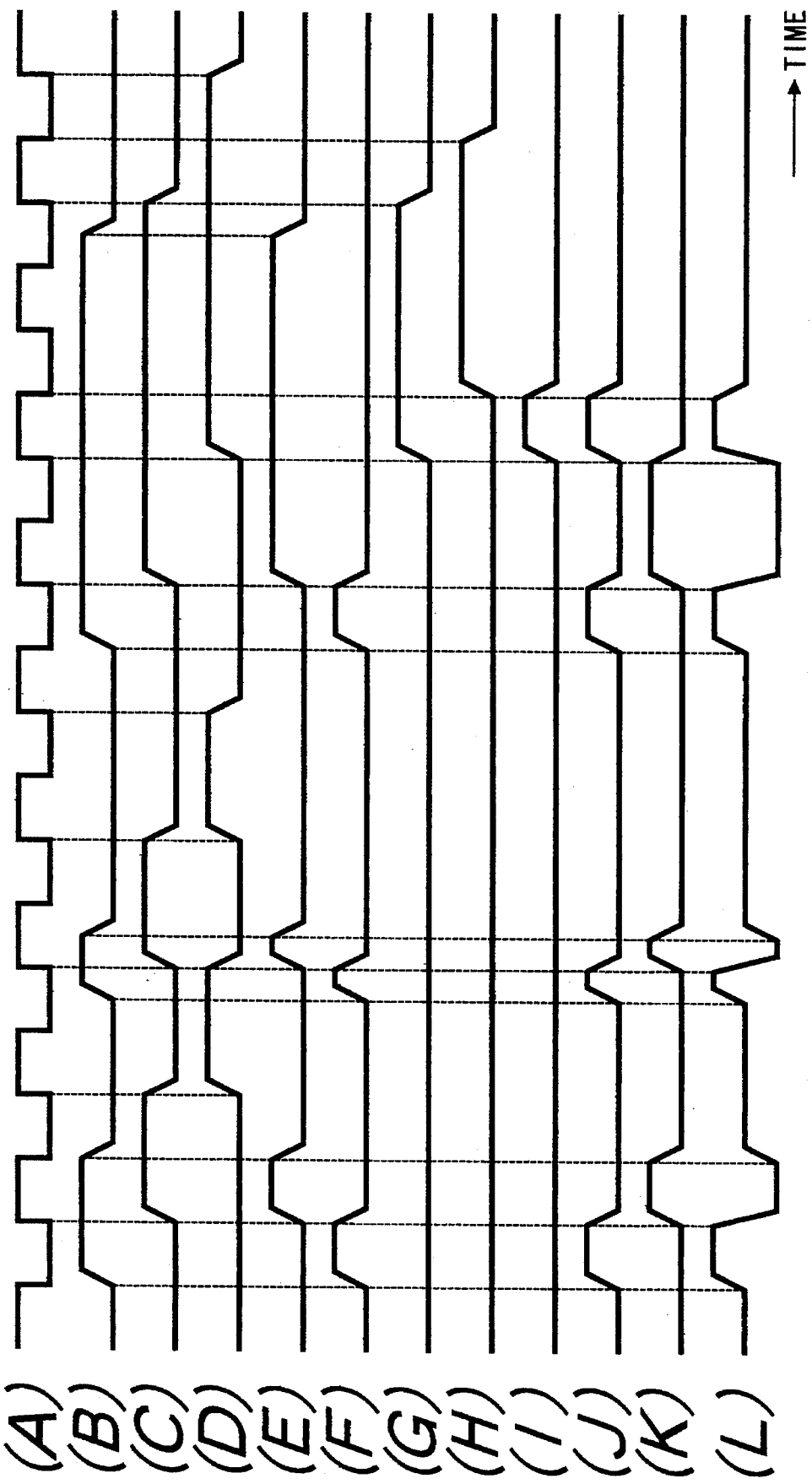
FIG. 4 is a time-domain diagram of signals in the phase comparator in FIG. 3.

The AND gate 52 executes AND operation between the upper data (see the portion (B) of FIG. 4) and the Q output signal of the D-flip-flop 50 (see the portion (C) of FIG. 4), thereby generating and outputting a signal which has a waveform such as shown in the portion (E) of FIG. 4. An output signal of the D-flip-flop 50 which appears at its inverting output terminal QN is applied to the AND gate 54. The AND gate 54 executes AND operation between the upper data (see the portion (B) of FIG. 4) and the QN output signal of the D-flip-flop 50, thereby generating and outputting a signal which has a waveform such as shown in the portion (F) of FIG. 4. The AND gate 58 executes AND operation between the Q output signal of the D-flip-flop 50 (see the portion (C) of FIG. 4) and the Q output signal of the D-flip-flop 56 (see the portion (D) of FIG. 4), thereby generating and outputting a signal which has a waveform such as shown in the portion (G) of FIG. 4. An output signal of the D-flip-flop 56 which appears at its inverting output terminal QN is applied to the AND gate 60. The AND gate 60 executes AND operation between the QN output signal of the D-flip-flop 56 and the output signal of the AND gate 52 (see the portion (E) of FIG. 4), thereby generating and outputting a signal which has a waveform such as shown in the portion (K) of FIG. 4. The output signal of the AND gate 60 (see the portion (K) of FIG. 4) constitutes the discharge signal D1.

The output signal of the AND gate 58 (see the portion (G) of FIG. 4) is latched by the D-flip-flop 62 at every strobe point of the inversion of the reproduced clock signal (that is, at every moment of the occurrence of a falling or negative-going edge in the reproduced clock signal). Thus, an output signal of the D-flip-flop 62 which appears at its non-inverting output terminal Q has a waveform such as shown in the portion (H) of FIG. 4. On the other hand, an output signal of the D-flip-flop 62 which appears at its inverting output terminal QN agrees with an inversion of the Q output signal thereof. The AND gate 64 executes AND operation between the QN output signal of the D-flip-flop 62 and the output signal of the AND gate 58 (see the portion (G) of FIG. 4), thereby generating and outputting a signal which has a waveform such as shown in the portion (I) of FIG. 4. The OR gate 66 executes OR operation between the output signal of the AND gate 54 (see the portion (F) of FIG. 4) and the output signal of the AND gate 64 (see the portion (I) of FIG. 4), thereby generating and outputting a signal which has a waveform such as shown in the portion (J) of FIG. 4. The output signal of the OR gate 66 (see the portion (J) of FIG. 4) constitutes the charge signal C1.

The phase comparator 32 receives the lower data from the signal detector 24. The phase comparator 32 processes the lower data in response to the reproduced clock signal in a manner similar to the manner of the processing of the upper data by the phase comparator 30. Thereby, the phase comparator 32 generates and outputs the charge signal C2 and the discharge signal D2 in response to the lower data.

Figure 5:
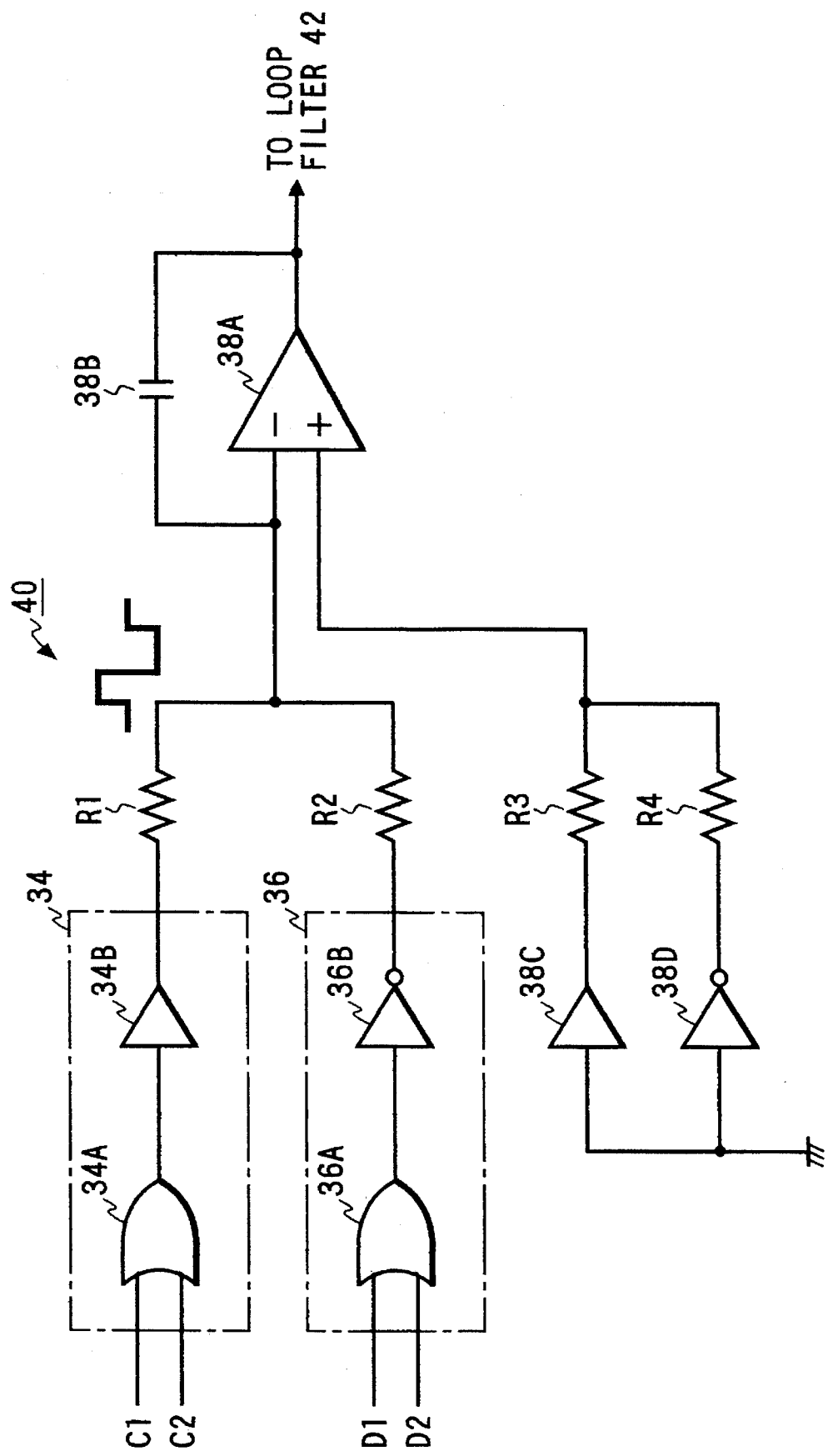
FIG. 5 is a diagram of a charge pump circuit in the apparatus of FIG. 1.

The charge pump circuit 40 will now be described in more detail. As shown in FIG. 5, the OR gate 34 in the charge pump circuit 40 includes an OR element 34A and a buffer 34B. First and second input terminals of the OR element 34A receive the charge signals C1 and C2 from the phase comparators 30 and 32 respectively. The output terminal of the OR element 34A leads to the input terminal of the buffer 34B. The output terminal of the buffer 34B is connected via a resistor R1 to the inverting input terminal of an operational amplifier 38A in the charge pump circuit 40. The NOR gate 36 in the charge pump circuit 40 includes an OR element 36A and an inverter 36B. First and second input terminals of the OR element 36A receive the discharge signals D1 and D2 from the phase comparators 30 and 32 respectively. The output terminal of the OR element 36A leads to the input terminal of the inverter 36B. The output terminal of the inverter 36B is connected via a resistor R2 to the inverting input terminal of the operational amplifier 38A.

As shown in FIG. 5, the charge pump circuit 40 includes a buffer 38C and an inverter 38D which are equivalent to the buffer 34B and the inverter 36B respectively. The input terminals of the buffer 38C and the inverter 38D are grounded. The output terminal of the buffer 38C is connected to the non-inverting input terminal of the operational amplifier 38A via a resistor R3 equivalent to the resistor R1. The output terminal of the inverter 38D is connected to the non-inverting input terminal of the operational amplifier 38A via a resistor R4 equivalent to the resistor R2. A capacitor 38B is connected between the output terminal of the operational amplifier 38A and the inverting input terminal of the operational amplifier 38A. Accordingly, the operational amplifier 38A and the capacitor 38B compose an integrator corresponding to the integrator 38 in the charge pump circuit 40. The output terminal of the operational amplifier 38A, that is, the output terminal of the integrator 38, is connected to the input terminal of the loop filter 42 (see FIG. 1).

The charge signals C1 and C2 are transmitted to the operational amplifier 38A via the OR element 34A, the buffer 34B, and the resistor R1. The discharge signals D1 and D2 are transmitted to the operational amplifier 38A via the OR element 36A, the inverter 36B, and the resistor R2. The charge signals C1 and C2 and the inversion of the discharge signals D1 and D2 are combined into a composite charge/discharge signal by an analog adding process at the junction between the resistors R1 and R2, and then the composite charge/discharge signal reaches the inverting input terminal of the operational amplifier 38A. The voltage of the output signal of the operational amplifier 38A (that is, the voltage of the integrator 38) increases in response to every effective pulse in the charge signal C1 or C2. The voltage of the output signal of the operational amplifier 38A (that is, the voltage of the integrator 38) decreases in response to every effective pulse in the discharge signal D1 or D2. In the case where a charge signal and a discharge signal vary as shown in the portions (J) and (K) of FIG. 4 respectively, the composite charge/discharge signal applied to the operational amplifier 38A has a waveform such as shown in the portion (L) of FIG. 4. The operational amplifier 38A executes a process of charging and discharging the capacitor 38B in response to the composite charge/discharge signal. The output signal of the operational amplifier 38A (that is, the output signal of the integrator 38) constitutes the output signal of the charge pump circuit 40 which is fed to the loop filter 42 (see FIG. 1).

With reference back to FIG. 1, the signal reproducing circuit 28 receives the upper data and the lower data from the signal detectors 22 and 24 respectively. The signal reproducing circuit 28 receives the reproduced clock signal from the VCO 44 in the PLL circuit 26. The signal reproducing circuit 28 includes an OR gate which executes OR operation between the upper data and the lower data. The signal reproducing circuit 28 also includes a device (for example, a D-flip flop) for latching the output signal of the OR gate in response to the reproduced clock signal, and thereby converting the output signal of the OR gate into an original bi-level digital signal.

Overall operation of the apparatus of FIG. 1 will be described hereinafter. An information signal conforming to Partial Response Class 4 (PR 4) is read out from the magnetic tape 10 by the reproducing head 12. The readout information signal (the reproduced information signal) is outputted from the reproducing head 12 to the reproducing amplifier 14, being enlarged by the reproducing amplifier 14. The enlargement-resultant information signal is applied from the reproducing amplifier 14 to the waveform equalizer 16. The enlargement-resultant information signal is processed by the waveform equalizer 16. Specifically, the waveform equalizer 16 removes inter-symbol interference components from the enlargement-resultant information signal. The information signal outputted from the waveform equalizer 16 is directly applied to the analog adder 20 as a non-delayed information signal. The information signal outputted from the waveform equalizer 16 is transmitted through the delay line 18, being delayed by the clock period T. The delay-resultant information signal is applied from the delay line 18 to the analog adder 20 as a delayed information signal. The non-delayed information signal and the delayed information signal are added by the analog adder 20. The addition-resultant information signal is fed from the analog adder 20 to the signal detectors 22 and 24. As previously described, the addition-resultant information signal is converted by the signal detectors 22 and 24 into the upper data and the lower data respectively. The upper data and the lower data are applied from tile signal detectors 22 and 24 to the phase comparators 30 and 32 in the PLL circuit 26 respectively. The phase comparator 30 generates and outputs the charge signal C1 and the discharge signal D1 in response to the upper data and the reproduced clock signal by comparing the phases of the upper data and the reproduced clock signal. The phase comparator 32 generates and outputs the charge signal C2 and the discharge signal D2 in response to the lower data and the reproduced clock signal by comparing the phases of the lower data and the reproduced clock signal.

A consideration will now be given of conditions where effective pulses in the upper data and the lower date are relatively short so that the duration of every effective pulse contains only one strobe point of the reproduced clock signal. Under these conditions, the output signal of the analog adder 20 has a waveform such as shown in the portion (A) of FIG. 6. In addition, the upper data outputted from the signal detector 22 has a waveform such as shown in the portion (B) of FIG. 6, while the lower data outputted from the signal detector 24 has a waveform such as shown in the portion (C) of FIG. 6. It is now assumed that the reproduced clock signal has a waveform such as shown in the portion (D) of FIG. 6. Under these conditions, the combination of the charge signals C1 and C2, which is provided by the OR gate 34, has a waveform such as shown in the portion (E) of FIG. 6. On the other hand, the inversion of the combination of the discharge signals D1 and D2, which is provided by the NOR gate 36, has a waveform such as shown in the portion (F) of FIG. 6.

Figure 6:
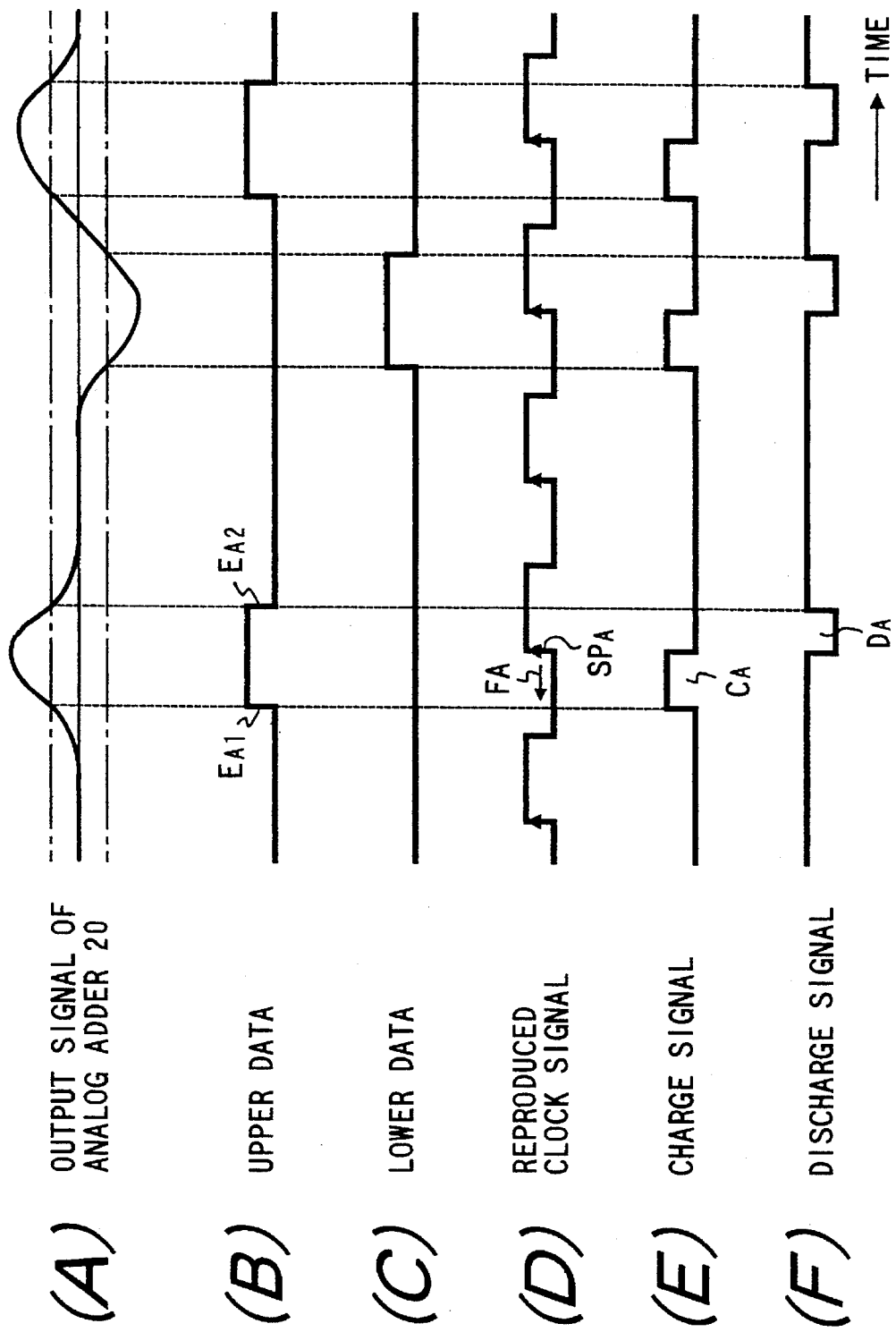
FIG. 6 is a time-domain diagram of signals in the apparatus of FIG. 1.

Under the conditions in FIG. 6, the leading edge of a first effective pulse CA in the combination of the charge signals C1 and C2 (see the portion (E) of FIG. 6) is caused by a first rising edge EA1 in the upper data (see the portion (B) of FIG. 6). The trailing edge of the first effective charge pulse CA (see the portion (E) of FIG. 6) is caused by a strobe point SPA of the reproduced clock signal (see the portion (D) of FIG. 6) which immediately follows the moment of the occurrence of the first rising edge EA1 in the upper data (see the portion (B) of FIG. 6). Similarly, the leading edge and the trailing edge of a second effective pulse or a later effective pulse in the combination of the charge signals C1 and C2 (see the portion (E) of FIG. 6) are determined by a rising edge in the upper data (or the lower data) and a strobe point of the reproduced clock signal.

Under the conditions in FIG. 6, the leading edge of a first effective pulse DA in the inversion of the combination of the discharge signals D1 and D2 (see the portion (F) of FIG. 6) is caused by the strobe point SPA of the reproduced clock signal (see the portion (D) of FIG. 6). The trailing edge of the first effective discharge pulse DA (see the portion (F) of FIG. 6) is caused by a first falling edge EA2 in the upper data (see the portion (B) of FIG. 6) which immediately follows the strobe point SPA of the reproduced clock signal (see the portion (D) of FIG. 6). Similarly, the leading edge and the trailing edge of a second effective pulse or a later effective pulse in the inversion of the combination of the discharge signals D1 and D2 (see the portion (F) of FIG. 6) are determined by a strobe point of the reproduced clock signal and a falling edge in the upper data (or the lower data).

The combination of the charge signals C1 and C2 is fed from the OR gate 34 to the integrator 38. The inversion of the combination of the discharge signals D1 and D2 is fed from the NOR gate 36 to the integrator 38. In the case where a phase error or a frequency error occurs between the reproduced information signal (the upper data and the lower data) and the reproduced clock signal, a difference is present between the duration of (the time-domain area occupied by) every effective pulse in the combination of the charge signals C1 and C2 and the duration of (the time-domain area occupied by) every effective pulse in the inversion of the combination of the discharge signals D1 and D2. The integrator 38 detects such a difference, and outputs a signal representing the detected difference. The difference-representing signal is fed from the integrator 38 to the VCO 44 via the loop filter 42 as a control signal for the VCO 44. The VCO 44 adjusts the phase or the frequency of the reproduced clock signal in response to the control signal to nullify the above-indicated phase error between the reproduced information signal and the reproduced clock signal.

Under the conditions in FIG. 6, the effective pulse CA in the combination of the charge signals C1 and C2 and the effective pulse DA in the inversion of the combination of the discharge signals D1 and D2 are added by the integrator 38 so that a signal representing a difference in duration (pulse width) between the effective pulses CA and DA is outputted from the integrator 38. The difference-representing signal is fed from the integrator 38 to the VCO 44 via the loop filter 42 as a control signal for the VCO 44. The VCO 44 adjusts the phase or the frequency of the reproduced clock signal in response to the control signal to nullify the above-indicated phase error between the reproduced information signal and the reproduced clock signal. Under the conditions in FIG. 6, the phase adjustment of the reproduced clock signal by the VCO 44 moves a timing of a strobe point in a direction FA as shown in the portion (D) of FIG. 6. As a result, the reproduced clock signal remains in a good synchronized relation or a good timing relation with the reproduced information signal.

A consideration will now be given of conditions where effective pulses in the upper data and the lower date are relatively long so that the duration of every effective pulse contains two or more strobe points of the reproduced clock signal. Under these conditions, the output signal of the analog adder 20 has a waveform such as shown in the portion (A) of FIG. 7. In addition, the upper data outputted from the signal detector 22 has a waveform such as shown in the portion (B) of FIG. 7, while the lower data outputted from the signal detector 24 has a waveform such as shown in the portion (C) of FIG. 7. It is now assumed that the reproduced clock signal has a waveform such as shown in the portion (D) of FIG. 7. Under these conditions, the combination of the charge signals C1 and C2, which is provided by the OR gate 34, has a waveform such as shown in the portion (E) of FIG. 7. On the other hand, the inversion of the combination of the discharge signals D1 and D2, which is provided by the NOR gate 36, has a waveform such as shown in the portion (F) of FIG. 7.

Figure 7:
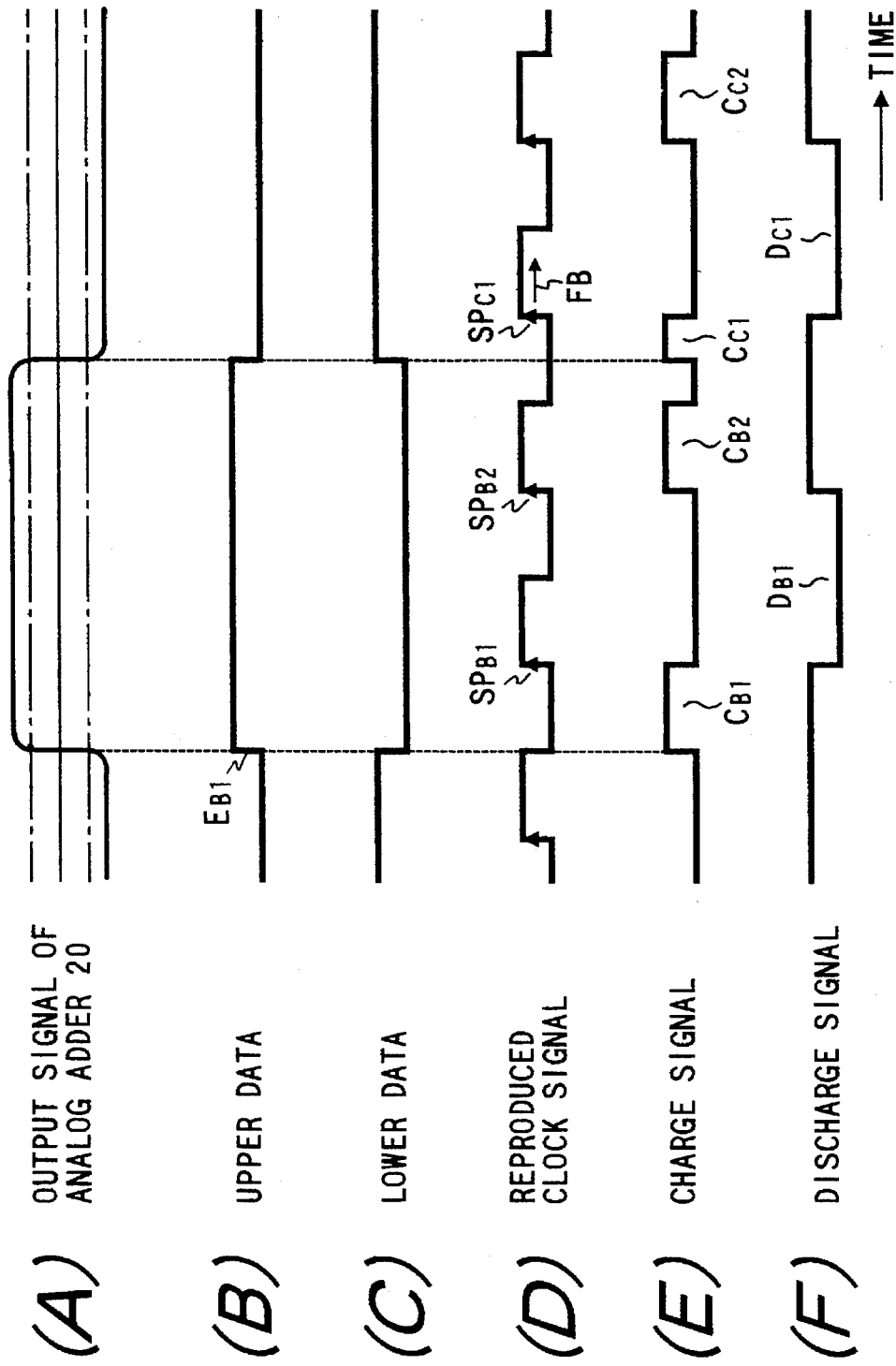
FIG. 7 is a time-domain diagram of signals in the apparatus of FIG. 1.

Under the conditions in FIG. 7, the leading edge of a first effective pulse CB1 in the combination of the charge signals C1 and C2 (see the portion (E) of FIG. 7) is caused by a first rising edge EB1 in the upper data (see the portion (B) of FIG. 7). The trailing edge of the first effective charge pulse CB1 (see the portion (E) of FIG. 7) is caused by a strobe point SPB1 of the reproduced clock signal (see the portion (D) of FIG. 7) which immediately follows the moment of the occurrence of the first rising edge EB1 in the upper data (see the portion (B) of FIG. 7). On the other hand, the leading edge of a first effective pulse DB1 in the inversion of the combination of the discharge signals D1 and D2 (see the portion (F) of FIG. 7) is caused by the strobe point SPB1 of the reproduced clock signal (see the portion (D) of FIG. 7). The trailing edge of the first effective discharge pulse DB1 (see the portion (F) of FIG. 7) is caused by a subsequent strobe point SPB2 of the reproduced clock signal (see the portion (D) of FIG. 7). The leading edge of a second effective pulse CB2 in the combination of the charge signals C1 and C2 (see the portion (E) of FIG. 7) is coincident with the trailing edge of the first effective discharge pulse DB1 (see the portion (F) of FIG. 7). The duration of the second effective charge pulse CB2 (see the portion (E) of FIG. 7) is equal to a half of the period of the reproduced clock signal (see the portion (D) of FIG. 7). Similarly, third and later effective pulses CC1 and CC2 are generated in the combination of the charge signals C1 and C2 (see the portion (E) of FIG. 7), while a second effective pulse DC1 is generated in the inversion of the combination of the discharge pulses D1 and D2 (see the portion (F) of FIG. 7).

The combination of the charge signals C1 and C2 is fed from the OR gate 34 to the integrator 38. The inversion of the combination of the discharge signals D1 and D2 is fed from the NOR gate 36 to the integrator 38. Under the conditions In FIG. 7, the integrator 38 serves to subtract the duration of the effective discharge pulse DB1 (see the portion (F) of FIG. 7) from the sum of the durations of the effective charge pulses CB1 and CB2 (see the portion (E) of FIG. 7). Since the duration of the effective discharge pulse DB1 is equal to the period of the reproduced clock signal while the duration of the effective charge pulse CB2 is equal to a half of the period of the reproduced clock signal, a half of the duration of the effective discharge pulse DB1 is cancelled by the duration of the effective charge pulse CB2 during the subtraction by the integrator 38. Accordingly, the integrator 38 detects a difference between the duration of the effective charge pulse CB1 and a half of the duration of the effective discharge pulse DB1. In the case where a phase error or a frequency error occurs between the reproduced information signal (the upper data and the lower data) and the reproduced clock signal, a difference is present between the duration of the effective charge pulse CB1 and a half of the duration of the effective discharge, pulse DB1. The integrator 38 detects such a difference, and outputs a signal representing the detected difference. The difference-representing signal is fed from the integrator 38 to the VCO 44 via the loop filter 42 as a control signal for the VCO 44. The VCO 44 adjusts the phase or the frequency of the reproduced clock signal in response to the control signal to nullify the above-indicated phase error between the reproduced information signal and the reproduced clock signal.

During a later stage of the conditions in FIG. 7, the effective charge pulses CC1 and CC2 and the effective discharge pulse DC1 are added by the integrator 38 so that a signal representing a difference between the duration of the effective discharge pulse DC1 and the sum of the effective charge pulses CC1 and CC2 is outputted from the integrator 38. The difference-representing signal is fed from the integrator 38 to the VCO 44 via the loop filter 42 as a control signal for the VCO 44. The VCO 44 adjusts the phase or the frequency of the reproduced clock signal in response to the control signal to nullify the above-indicated phase error between the reproduced information signal and the reproduced clock signal. Under the conditions in FIG. 7, the phase adjustment of the reproduced clock signal by the VCO 44 moves a timing of a strobe point in a direction FB as shown in the portion (D) of FIG. 7. As a result, the reproduced clock signal remains in a good synchronized relation or a good timing relation with the reproduced information signal.

Second Embodiment

Figure 8:
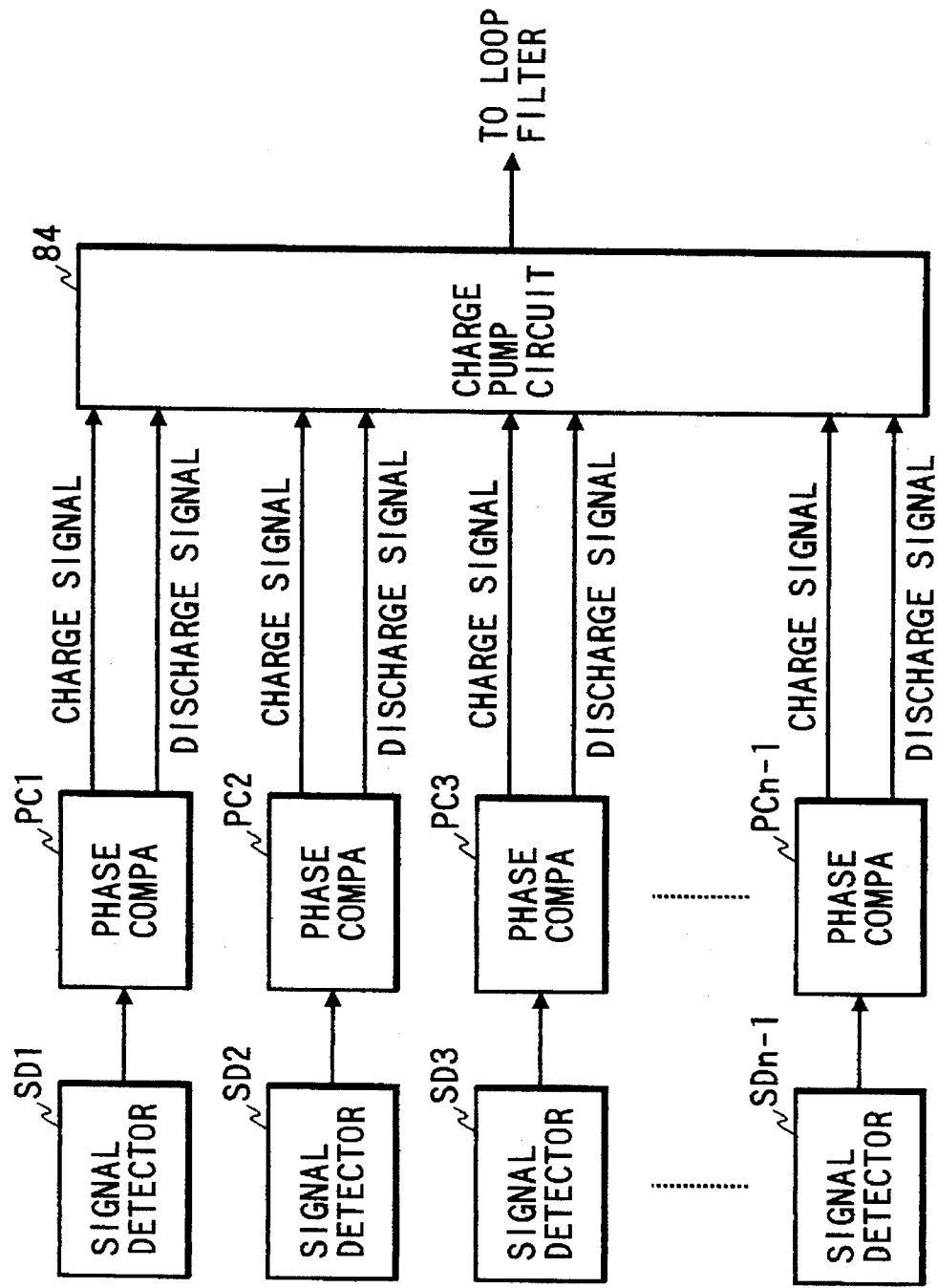
FIG. 8 is a block diagram of a portion of an information reproducing apparatus according to a second embodiment of this invention.

FIG. 8 shows a portion of a second embodiment of this invention which is similar to the embodiment of FIG. 1 except for design changes indicated hereinafter.

The embodiment of FIG. 8 is designed to handle an n-level information signal which does not conform to Partial Response Class 4 (PR 4), where "n" denotes a predetermined natural number different from three.

The embodiment of FIG. 8 includes signal detectors SD1, SD2, SD3, ... , and SDn–1 corresponding to the signal detectors 22 and 24 of FIG. 1. The signal detectors SD1, SD2, SD3, ... , and SDn–1 follow an analog adder 20 (see FIG. 1). The signal detectors SD1, SD2, SD3, ... , and SDn–1 are designed to sense different levels of the output signal of the analog adder 20 respectively.

The embodiment of FIG. 8 includes phase comparators PC1, PC2, PC3, ... , and PCn–1 corresponding to the phase comparators 30 and 32 of FIG. 1. The phase comparators PC1, PC2, PC3, ... , and PCn–1 follow the signal detectors SD1, SD2, SD3, ... , and SDn–1 respectively. Each of the phase comparators PC1, PC2, PC3, and PCn–1 outputs a charge signal and a discharge signal to a charge pump circuit 84 in response to the output signal of the related phase comparator. The charge pump circuit 84 corresponds to the charge pump circuit 40 of FIG. 1. The charge signals and the discharge signals outputted from the phase comparators PC1, PC2, PC3, ... , and PCn–1 are added or integrated by the charge pump circuit 84. The resultant output signal of the charge pump circuit 84 is fed to a loop filter 42 (see FIG. 1).

Third Embodiment

A third embodiment of this invention is similar to the embodiment of FIG. 1 except for design changes indicated hereinafter.

The third embodiment is designed to handle an information signal conforming to PR(1) or PR(1, –1), where PR means Partial Response. One of signal detectors 22 and 24 (see FIG. 1) and one of phase comparators 30 and 32 (see FIG. 1) may be omitted from the first embodiment (the third embodiment).

Fourth Embodiment

A fourth embodiment of this invention is similar to the embodiment of FIG. 1 except that the fourth embodiment is designed as a disk apparatus or a digital transmission apparatus.

Fifth Embodiment

A fifth embodiment of this invention is similar to the embodiment of FIG. 1 except for an additional arrangement described hereinafter.

The fifth embodiment includes a frequency detecting circuit added to the charge pump circuit 40 of FIG. 5. The frequency detecting circuit senses the frequency of a reproduced clock signal, and compares the frequency of the reproduced clock signal with a given frequency range. When the frequency of the reproduced clock signal is higher than the upper limit of the given frequency range, the frequency detecting circuit sets a discharge input side to a high level. When the frequency of the reproduced clock signal is lower than the lower limit of the given frequency range, the frequency detecting circuit sets a charge input side to a high level.

In the fifth embodiment, the frequency detecting circuit enables a wider lock-in range and a shorter lock-in time related to a PLL circuit.

Sixth Embodiment

A sixth embodiment of this invention is similar to the embodiment of FIG. 1 except for design changes described hereinafter. The sixth embodiment includes phase comparators 130 and 132 instead of the phase comparators 30 and 32 of FIG. 1 respectively.

The phase comparators 130 and 132 are similar to each other. The phase comparators 130 and 132 receive upper data and lower data from signal detectors 22 and 24 (see FIG. 1) respectively.

Figure 9:
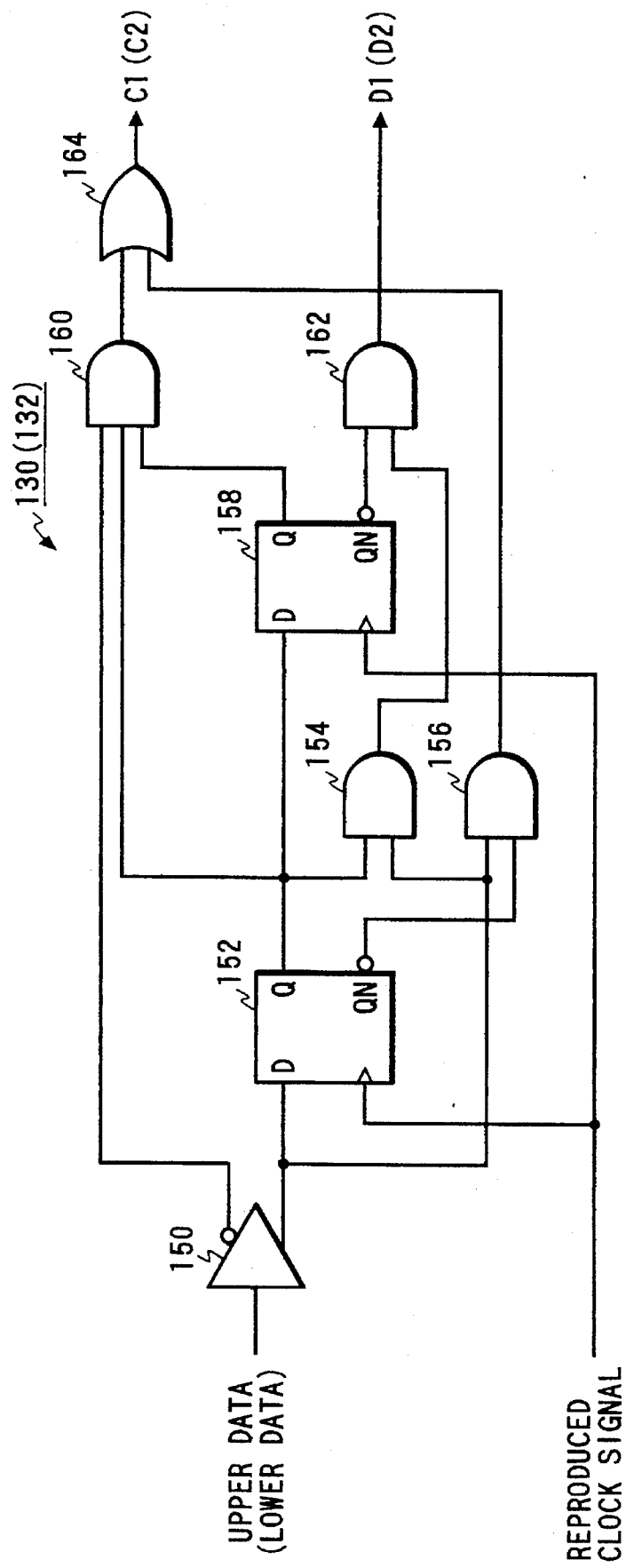
FIG. 9 is a block diagram of a phase comparator according to a sixth embodiment of this invention.

As shown in FIG. 9, the phase comparator 130 (or the phase comparator 132) includes a buffer 150, D-flip-flops 152 and 158, AND gates 154, 156, 160, and 162, and an OR gate 164. The input terminal of the buffer 150 receives the upper data from the signal detector 22 (or the lower data from the signal detector 24). The non-inverting output terminal of the buffer 150 is connected to the D input terminal of the D-flip-flop 152 and first input terminals of the AND gates 154 and 156. The inverting output terminal of the buffer 150 is connected to a first input terminal of the AND gate 160. The non-inverting output terminal Q of the D-flip-flop 152 is connected to second input terminals of the AND gates 154 and 160 and the D input terminal of the D-flip-flop 158. The inverting output terminal QN of the D-flip-flop 152 is connected to a second input terminal of the AND gate 156. The output terminal of the AND gate 154 leads to a first input terminal of the AND gate 162. The output terminal of the AND gate 156 leads to a first input terminal of the OR gate 164. The non-inverting output terminal Q of the D-flip-flop 158 is connected to a third input terminal of the AND gate 160. The inverting output terminal QN of the D-flip-flop 158 is connected to a second input terminal of the AND gate 162. The AND gate 162 outputs a discharge signal D1 or D2 to a NOR gate 36 (see FIG. 1) in a charge pump circuit 40. The output terminal of the AND gate 160 leads to a second input terminal of the OR gate 164. The OR gate 164 outputs a charge signal C1 or C2 to an OR gate 34 (see FIG. 1) in the charge pump circuit 40. The clock input terminals of the D-flip-flop 152 and 158 receive a reproduced clock signal from a VCO 44 (see FIG. 1).

The phase comparators 130 and 132 are similar in operation. Accordingly, only operation of the phase comparator 130 will now be described. The reproduced clock signal applied to the D-flip-flops 152 and 158 has a waveform such as shown in the portion (A) of FIG. 10. The upper data fed from the signal detector 22 (see FIG. 1) to the buffer 150 has a waveform such as shown in the portion (B) of FIG. 10. The upper data passes through the buffer 150, and then reaches the D-flip-flop 152. The upper data is latched by the D-flip-flop 152 at every strobe point of the reproduced clock signal (that is, at every moment of the occurrence of a rising or positive-going edge in the reproduced clock signal). Thus, an output signal of the D-flip-flop 152 which appears at its non-inverting output terminal Q has a waveform such as shown in the portion (C) of FIG. 10. The Q output signal of the D-flip-flop 152 (see the portion (C) of FIG. 10) is latched by the D-flip-flop 158 at every strobe point of the reproduced clock signal (that is, at every moment of the occurrence of a rising or positive-going edge in the reproduced clock signal). Thus, an output signal of the B-flip-flop 158 which appears at its non-inverting output terminal Q has a waveform such as shown in the portion (D) of FIG. 10.

Figure 10:
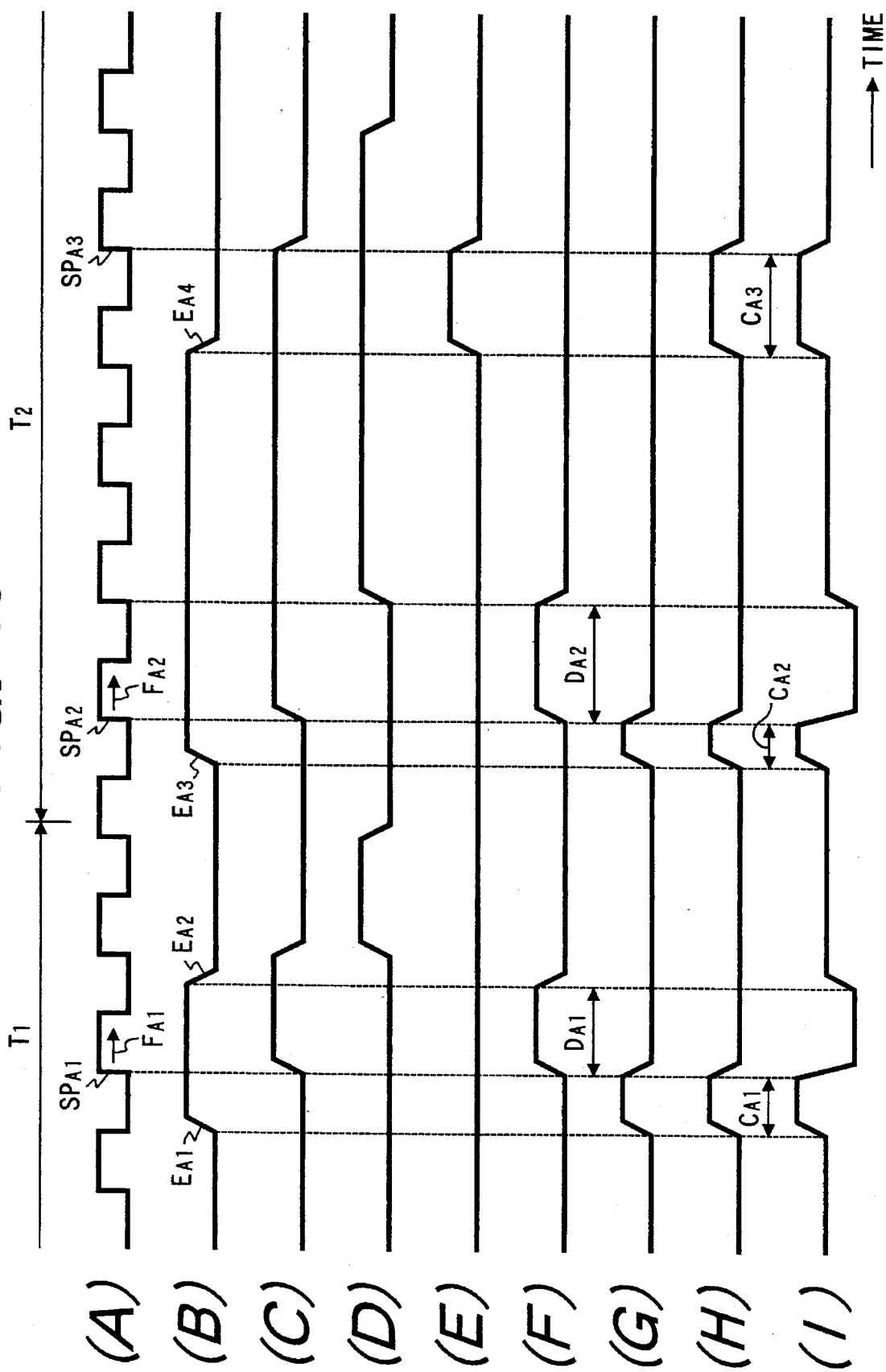
FIG. 10 is a time-domain diagram of signals in the phase comparator of FIG. 9.

The upper data (see the portion (B) of FIG. 10) reaches the AND gates 154 and 156 after passing through the buffer 150. The Q output signal of the D-flip-flop 152 (see the portion (C) of FIG. 10) is applied to the AND gate 154. The AND gate 154 executes AND operation between the upper data (see the portion (B) of FIG. 10) and the Q output signal of the D-flip-flop 152 (see the portion (C) of FIG. 10). The output signal of the AND gate 154 is applied to the AND gate 162. An output signal of the D-flip-flop 158 which appears at its inverting output terminal QN is applied to the AND gate 162. The AND gate 162 executes AND operation between the output signal of the AND gate 154 and the QN output signal of the D-flip-flop 158, thereby generating and outputting a signal which has a waveform such as shown in the portion (F) of FIG. 10. The output signal of the AND gate 162 constitutes the discharge signal D1.

An output signal of the D-flip-flop 152 which appears at its inverting output terminal QN is applied to the AND gate 156. The AND gate 156 executes AND operation between the upper data (see the portion (B) of FIG. 10) and the QN output signal of the D-flip-flop 152, thereby generating and outputting a signal which has a waveform such as shown in the portion (G) of FIG. 10. The output signal of the AND gate 156 is applied to the OR gate 164.

The buffer 150 outputs the inversion of the upper data to the AND gate 160. The Q output signals of the D-flip-flops 152 and 158 are fed to the AND gate 160. The AND gate 160 executes AND operation among the inversion of the upper data and the Q output signals of the D-flip-flops 152 and 158, thereby generating and outputting a signal which has a waveform such as shown in the portion (E) of FIG. 10. The output signal of the AND gate 164 is applied to the OR gate 164. The OR gate 164 executes OR operation between the output signal of the AND gate 156 (see the portion (G) of FIG. 10) and the output signal of the AND gate 160 (see the portion (E) of FIG. 10), thereby generating and outputting a signal which has a waveform such as shown in the portion (H) of FIG. 10. The output signal of the OR gate 164 constitutes the charge signal C1.

The phase comparator 132 receives the lower data from the signal detector 24 (see FIG. 1). The phase comparator 132 processes the lower data in response to the reproduced clock signal in a manner similar to the manner of the processing of the upper data by the phase comparator 130. Thereby, the phase comparator 132 generates and outputs the charge signal C2 and the discharge signal D2 in response to the lower data.

In the case where a discharge signal and a charge signal vary as shown in the portions (F) and (H) of FIG. 10 respectively, a composite charge/discharge signal applied to an operational amplifier 38A (see FIG. 5) has a waveform such as shown in the portion (I) of FIG. 10.

A consideration will now be given of conditions where effective pulses in the upper data and the lower date are relatively short so that the duration of every effective pulse contains only one strobe point of the reproduced clock signal. An example of these conditions occurs during an interval T1 in FIG. 10. During the interval T1 in FIG. 10, the leading edge of an effective pulse CA1 in the charge signal C1 (see the portion (H) of FIG. 10) is caused by a first rising edge EA1 in the upper data (see the portion (B) of FIG. 10). The trailing edge of the effective charge pulse CA1 (see the portion (H) of FIG. 10) is caused by a strobe point SPA1 of the reproduced clock signal (see the portion (A) of FIG. 10) which immediately follows the moment of the occurrence of the first rising edge EA1 in the upper data (see the portion (B) of FIG. 10). On the other hand, the leading edge of an effective pulse DA1 in the discharge signal D1 (see the portion (F) of FIG. 10) is caused by the strobe point SPA1 of the reproduced clock signal (see the portion (A) of FIG. 10). The trailing edge of the effective discharge pulse DA1 (see the portion (F) of FIG. 10) is caused by a first falling edge EA2 in the upper data (see the portion (B) of FIG. 10) which immediately follows the strobe point SPA1 of the reproduced clock signal (see the portion (A) of FIG. 10).

Similarly, effective pulses in the charge signal C2 and the discharge signal D2 are generated in response to the lower data and the reproduced clock signal.

The phase comparators 130 and 132 output the charge signals C1 and C2 to an OR gate 34 (see FIG. 1) in the charge pump circuit 40. The combination of the charge signals C1 and C2 is provided by the OR gate 34. The phase comparators 130 and 132 output the discharge signals D1 and D2 to a NOR gate 36 (see FIG. 1) in the charge pump circuit 40. The inversion of the combination of the discharge signals D1 and D2 is provided by the NOR gate 36.

The combination of the charge signals C1 and C2 is fed from the OR gate 34 to an integrator 38 (see FIG. 1) in the charge pump circuit 40. The inversion of the combination of the discharge signals D1 and D2 is fed from the NOR gate 36 to the integrator 38. In the case where a phase error or a frequency error occurs between the reproduced information signal (the upper data and the lower data) and the reproduced clock signal, a difference is present between the duration of (the time-domain area occupied by) every effective pulse in the combination of the charge signals C1 and C2 and the duration of (the time-domain area occupied by) every effective pulse in the inversion of the combination of the discharge signals D1 and D2. The integrator 38 detects such a difference, and outputs a signal representing the detected difference. The difference-representing signal is fed from the integrator 38 to the VCO 44 via a loop filter 42 (see FIG. 1) as a control signal for the VCO 44. The VCO 44 adjusts the phase or the frequency of the reproduced clock signal in response to the control signal to nullify the above-indicated phase error between the reproduced information signal and the reproduced clock signal.

During the interval T1 in FIG. 10, the effective charge pulse CA1 (see the portion (H) of FIG. 10) and the inversion of the effective discharge pulse DA1 (see the portion (F) of FIG. 10) are added by the integrator 38 so that a signal representing a difference in duration (pulse width) between the effective pulses CA1 and DA1 is outputted from the integrator 38. The difference-representing signal is fed from the integrator 38 to the VCO 44 via the loop filter 42 as a control signal for the VCO 44. The VCO 44 adjusts the phase or the frequency of the reproduced clock signal in response to the control signal to nullify the above-indicated phase error between the reproduced information signal and the reproduced clock signal. During the interval T1 in FIG. 10, the phase adjustment of the reproduced clock signal by the VCO 44 moves a timing of a strobe point in a direction FA1 as shown in the portion (A) of FIG. 10. As a result, the reproduced clock signal remains in a good synchronized relation or a good timing relation with the reproduced information signal.

A consideration will now be given of conditions where effective pulses in the upper data and the lower date are relatively long so that the duration of every effective pulse contains two or more strobe points of the reproduced clock signal. An example of these conditions occurs during an interval T2 in FIG. 10. During the interval T2 in FIG. 10, the leading edge of an effective pulse CA2 in the charge signal C1 (see the portion (H) of FIG. 10) is caused by a rising edge EA3 in the upper data (see the portion (B) of FIG. 10). The trailing edge of the effective charge pulse CA2 (see the portion (H) of FIG. 10) is caused by a strobe point SPA2 of the reproduced clock signal (see the portion (A) of FIG. 10) which immediately follows the moment of the occurrence of the rising edge EA3 in the upper data (see the portion (B) of FIG. 10). On the other hand, the leading edge of an effective pulse DA2 in the discharge signal D1 (see the portion (F) of FIG. 10) is caused by the strobe point SPA2 of the reproduced clock signal (see the portion (A) of FIG. 10). The trailing edge of the effective discharge pulse DA2 (see the portion (F) of FIG. 10) is caused by a subsequent strobe point of the reproduced clock signal (see the portion (A) of FIG. 10). The leading edge of a subsequent effective pulse CA3 in the charge signal C1 (see the portion (H) of FIG. 10) is caused by a falling edge EA4 in the upper data (see the portion B) of FIG. 10). The trailing edge of the effective charge pulse CA3 is caused by a strobe point SPA3 of the reproduced clock signal (see the portion (A) of FIG. 10) which immediately follows the moment of the occurrence of the falling edge EA4 in the upper data (see the portion (B) of FIG. 10).

Similarly, effective pulses in the charge signal C2 and the discharge signal D2 are generated in response to the lower data and the reproduced clock signal.

The phase comparators 130 and 132 output the charge signals C1 and C2 to the OR gate 34 in the charge pump circuit 40. The combination of the charge signals C1 and C2 is provided by the OR gate 34. The phase comparator 130 and 132 output the discharge signals D1 and D2 to the NOR gate 36 in the charge pump circuit 40. The inversion of the combination of the discharge signals D1 and D2 is provided by the NOR gate 36.

The combination of the charge signals C1 and C2 is fed from the OR gate 34 to the integrator 38 in the charge pump circuit 40. The inversion of the combination of the discharge signals D1 and D2 is fed from the NOR gate 36 to the integrator 38. During the interval T2 in FIG. 10, the integrator 38 serves to subtract the duration of the effective discharge pulse DA2 (see the portion (F) of FIG. 10) from the sum of the durations of the effective charge pulses CA2 and CA3 (see the portion (H) of FIG. 10). In the case where a phase error or a frequency error occurs between the reproduced information signal (the upper data and the lower data) and the reproduced clock signal, a difference is present between the duration of the effective discharge pulse DA2 and the sum of the durations of the effective charge pulses CA2 and CA3. The integrator 38 detects such a difference, and outputs a signal representing the detected difference. The difference-representing signal is fed from the integrator 38 to the VCO 44 via the loop filter 42 as a control signal for the VCO 44. The VCO 44 adjusts the phase or the frequency of the reproduced clock signal in response to the control signal to nullify the above-indicated phase error between the reproduced information signal and the reproduced clock signal. During the interval T2 in FIG. 10, the phase adjustment of the reproduced clock signal by the VCO 44 moves a timing of a strobe point in a direction FA2 as shown in the portion (A) of FIG. 10. As a result, the reproduced clock signal remains in a good synchronized relation or a good timing relation with the reproduced information signal.

Seventh Embodiment

A seventh embodiment of this invention is similar to the embodiment of FIG. 1 except for design changes described hereinafter. The seventh embodiment includes phase comparators 230 and 232 instead of the phase comparators 30 and 32 of FIG. 1 respectively.

The phase comparators 230 and 232 are similar to each other. The phase comparators 230 and 232 receive upper data and lower data from signal detectors 22 and 24 (see FIG. 1) respectively.

Figure 11:
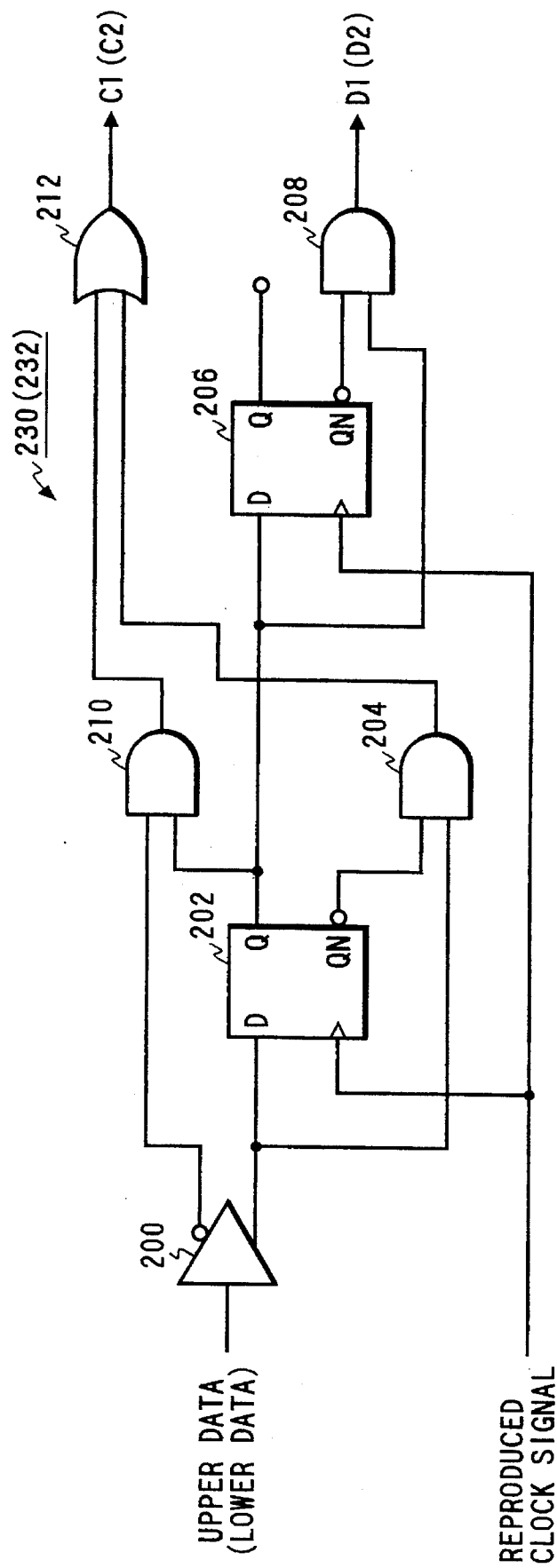
FIG. 11 is a block diagram of a phase comparator according to a seventh embodiment of this invention.

As shown in FIG. 11, the phase comparator 230 (or the phase comparator 232) includes a buffer 200, D-flip-flops 202 and 206, AND gates 204, 208, and 210, and an OR gate 212. The input terminal of the buffer 200 receives the upper data from the signal detector 22 (or the lower data from the signal detector 24). The non-inverting output terminal of the buffer 200 is connected to the D input terminal of the D-flip-flop 202 and a first input terminal of the AND gate 204. The inverting output terminal of the buffer 200 is connected to a first input terminal of the AND gate 210. The non-inverting output terminal Q of the D-flip-flop 202 is connected to a second input terminal of the AND gate 210, the D input terminal of the D-flip-flop 206, and a first input terminal of the AND gate 208. The inverting output terminal QN of the D-flip-flop 202 is connected to a second input terminal of the AND gate 204. The output terminal of the AND gate 204 leads to a first input terminal of the OR gate 212. The output terminal of the AND gate 210 leads to a second input terminal of the OR gate 212. The OR gate 212 outputs a charge signal C1 or C2 to an OR gate 34 (see FIG. 1) in a charge pump circuit 40. The inverting output terminal QN of the D-flip-flop 206 is connected to a second input terminal of the AND gate 208. The AND gate 208 outputs a discharge signal D1 or D2 to a NOR gate 36 (see FIG. 1) in the charge pump circuit 40. The clock input terminals of the D-flip-flop 202 and 206 receive a reproduced clock signal from a VCO 44 (see FIG. 1).

The phase comparators 230 and 232 are similar in operation. Accordingly, only operation of the phase comparator 230 will now be described. The reproduced clock signal applied to the D-flip-flops 202 and 206 has a waveform such as shown in the portion (A) of FIG. 12. The upper data fed from the signal detector 22 (see FIG. 1) to the buffer 200 has a waveform such as shown in the portion (B) of FIG. 12. The upper data passes through the buffer 200, and then reaches the D-flip-flop 202. The upper data is latched by the D-flip-flop 202 at every strobe point of the reproduced clock signal (that is, at every moment of the occurrence of a rising or positive-going edge in the reproduced clock signal). Thus, an output signal of the D-flip-flop 202 which appears at its non-inverting output terminal Q has a waveform such as shown in the portion (C) of FIG. 12. The Q output signal of the D-flip-flop 202 (see the portion (C) of FIG. 12) is latched by the D-flip-flop 206 at every strobe point of the reproduced clock signal (that is, at every moment of the occurrence of a rising or positive-going edge in the reproduced clock signal). Thus, an output signal of the D-flip-flop 206 which appears at its non-inverting output terminal Q has a waveform such as shown in the portion (D) of FIG. 12.

Figure 12:
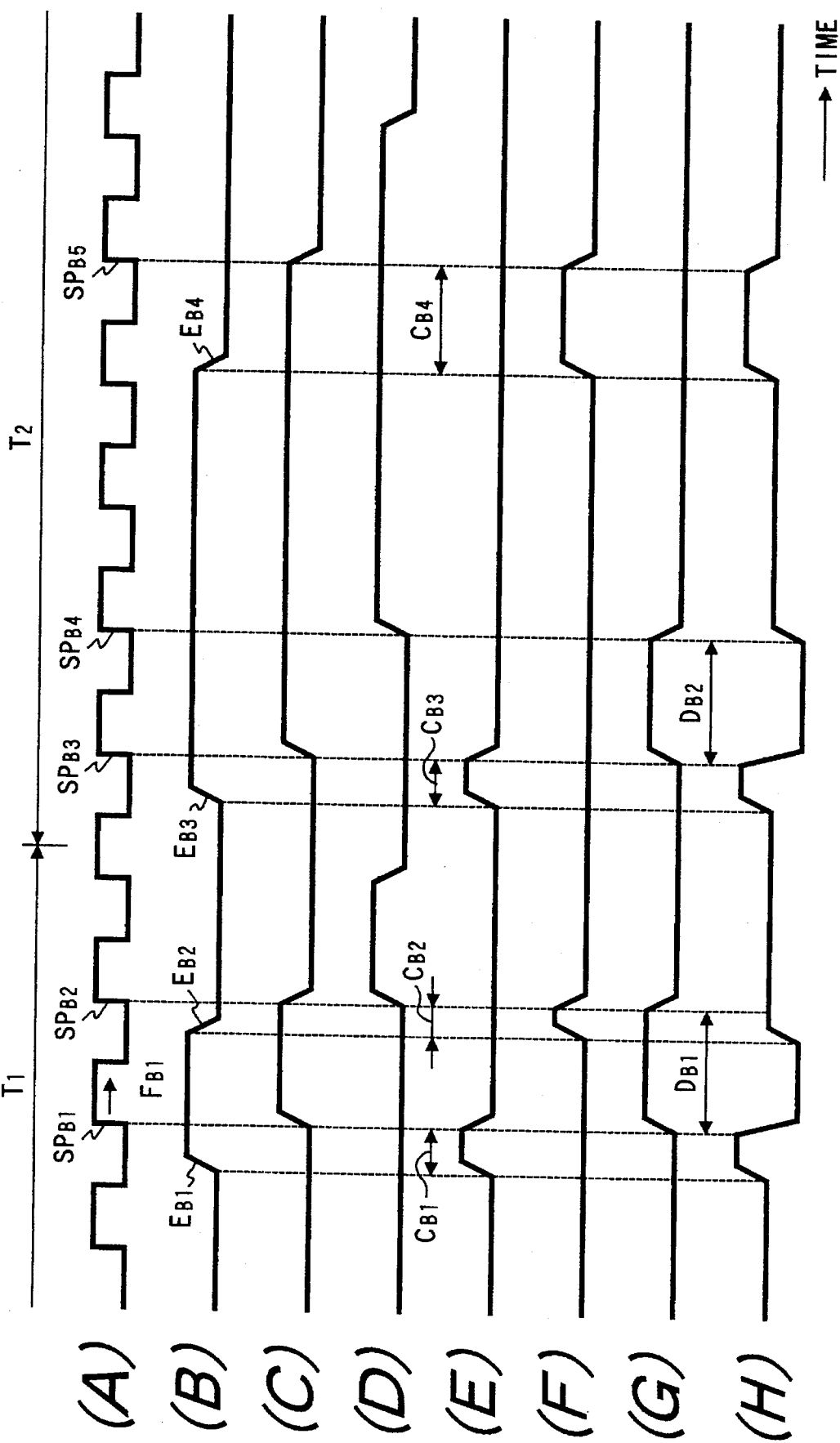
FIG. 12 is a time-domain diagram of signals in the phase comparator of FIG. 11.

The upper data (see the portion (B) of FIG. 12) reaches the AND gate 204 after passing through the buffer 200. An output signal of the D-flip-flop 202 which appears at its inverting output terminal QN is applied to the AND gate 204. The AND gate 204 executes AND operation between the upper data (see the portion (B) of FIG. 12) and the QN output signal of the D-flip-flop 202, thereby generating and outputting a signal which has a waveform such as shown in the portion (E) of FIG. 12. The buffer 200 outputs the inversion of the upper data to the AND gate 210. The Q output signal of the D-flip-flop 202 (see the portion (C) of FIG. 12) is applied to the AND gate 210. The AND gate 210 executes AND operation between the inversion of the upper data and the Q output signal of the D-flip-flop 202 (see the portion (C) of FIG. 12), thereby generating and outputting a signal which has a waveform such as shown in the portion (F) of FIG. 12. The output signal of the AND gate 204 (see the portion (E) of FIG. 12) is applied to the OR gate 212. The output signal of the AND gate 2 10 (see the portion (F) of FIG. 12) is applied to the OR gate 212. The OR gate 212 executes OR operation between the output signal of the AND gate 204 (see the portion (E) of FIG. 12) and the output signal of the AND gate 210 (see the portion (F) of FIG. 12). The output signal of the OR gate 212 constitutes the charge signal C1. The Q output signal of the D-flip-flop 202 (see the portion (C) of FIG. 12) is applied to the AND gate 208. An output signal of the D-flip-flop 206 which appears at its inverting output terminal QN is applied to the AND gate 208. The AND gate 208 executes AND operation between the Q output signal of the D-flip-flop 202 (see the portion (C) of FIG. 12) and the QN output signal of the D-flip-flop 206, thereby generating and outputting a signal which has a waveform such as shown in the portion (G) of FIG. 12. The output signal of the AND gate 208 constitutes the discharge signal D1.

The phase comparator 232 receives the lower data from the signal detector 24 (see FIG. 1). The phase comparator 232 processes the lower data in response to the reproduced clock signal in a manner similar to the manner of the processing of the upper data by the phase comparator 230. Thereby, the phase comparator 232 generates and outputs the charge signal C2 and the discharge signal D2 in response to the lower data.

In the case where a discharge signal and a charge signal vary as shown in the portions (E), (F), and (G) of FIG. 12, a composite charge/discharge signal applied to an operational amplifier 38A (see FIG. 5) has a waveform such as shown in the portion (H) of FIG. 12.

A consideration will now be given of conditions where effective pulses in the upper data and the lower date are relatively short so that the duration of every effective pulse contains only one strobe point of the reproduced clock signal. An example of these conditions occurs during an interval T1 in FIG. 12. During the interval T1 in FIG. 12, the leading edge of an effective pulse CB1 in the charge signal C1 (see the portion (E) of FIG. 12) is caused by a first rising edge EB1 in the upper data (see the portion (B) of FIG. 12). The trailing edge of the effective charge pulse CB1 (see the portion (E) of FIG. 12) is caused by a strobe point SPB1 of the reproduced clock signal (see the portion (A) of FIG. 12) which immediately follows the moment of the occurrence of the first rising edge EB1 in the upper data (see the portion (B) of FIG. 12). On the other hand, the leading edge of an effective pulse DB1 in the discharge signal D1 (see the portion (G) of FIG. 12) is caused by the strobe point SPB1 of the reproduced clock signal (see the portion (A) of FIG. 12). The trailing edge of the effective discharge pulse DB1

(see the portion (G) of FIG. 12) is caused by a subsequent strobe point SPB2 of the reproduced clock signal (see the portion (A) of FIG. 12). The leading edge Of a next effective pulse CB2 in the charge signal C1 (see the portion (F) of FIG. 12) is caused by a first falling edge EB2 in the upper data (see the portion (B) of FIG. 12) which immediately follows the strobe point SPB1 of the reproduced clock signal (see the portion (A) of FIG. 12). The trailing edge of the effective charge pulse CB2 (see the portion (F) of FIG. 12) is caused by the strobe point SPB2 of the reproduced clock signal (see the portion (A) of FIG. 12).

Similarly, effective pulses in the charge signal C2 and the discharge signal D2 are generated in response to the lower data and the reproduced clock signal.

The phase comparators 230 and 232 output the charge signals C1 and C2 to an OR gate 34 (see FIG. 1) in the charge pump circuit 40. The combination of the charge signals C1 and C2 is provided by the OR gate 34. The phase comparators 230 and 232 output the discharge signals D1 and D2 to a NOR gate 36 (see FIG. 1) in the charge pump circuit 40. The inversion of the combination of the discharge signals D1 and D2 is provided by the NOR gate 36.

The combination of the charge signals C1 and C2 is fed from the OR gate 34 to the integrator 38 in the charge pump circuit 40. The inversion of the combination of the discharge signals D1 and D2 is fed from the NOR gate 36 to the integrator 38. During the interval T1 in FIG. 12, the integrator 38 serves to subtract the duration of the effective discharge pulse DB1 (see the portion (G) of FIG. 12) from the sum of the durations of the effective charge pulses CB1 and CB2 (see the portions (E) and (F) of FIG. 12). In the case where a phase error or a frequency error occurs between the reproduced information signal (the upper data and the lower data) and the reproduced clock signal, a difference is present between the duration of the effective discharge pulse DB1 and the sum of the durations of the effective charge pulses CB1 and CB2. The integrator 38 detects such a difference, and outputs a signal representing the detected difference. The difference-representing signal is fed from the integrator 38 to the VCO 44 via the loop filter 42 as a control signal for the VCO 44. The VCO 44 adjusts the phase or the frequency of the reproduced clock signal in response to the control signal to nullify the above-indicated phase error between the reproduced information signal and the reproduced clock signal. During the interval T1 in FIG. 12, the phase adjustment of the reproduced clock signal by the VCO 44 moves a timing of a strobe point in a direction FB1 as shown in the portion (A) of FIG. 12. As a result, the reproduced clock signal remains in a good synchronized relation or a good timing relation with the reproduced information signal.

A consideration will now be given of conditions where effective pulses in the upper data and the lower date are relatively long so that the duration of every effective pulse contains two or more strobe points of the reproduced clock signal. An example of these conditions occurs during an interval T2 in FIG. 12. During the interval T2 in FIG. 12, the leading edge of an effective pulse CB3 in the charge signal C1 (see the portion (E) of FIG. 12) is caused by a rising edge EB3 in the upper data (see the portion (B) of FIG. 12). The trailing edge of the effective charge pulse CB3 (see the portion (E) of FIG. 12) is caused by a strobe point SPB3 of the reproduced clock signal (see the portion (A) of FIG. 12) which immediately follows the moment of the occurrence of the rising edge EB3 in the upper data (see the portion (B) of FIG. 12). On the other hand, the leading edge of an effective pulse DB2 in the discharge signal D1 (see the portion (G) of FIG. 12) is caused by the strobe point SPB3 of the reproduced clock signal (see the portion (A) of FIG. 12). The trailing edge of the effective discharge pulse DB1 (see the portion (G) of FIG. 12) is caused by a subsequent strobe point SPB4 of the reproduced clock signal (see the portion (A) of FIG. 12). The leading edge of a next effective pulse CB4 in the charge signal C1 (see the portion (F) of FIG. 12) is caused by a falling edge EB4 in the upper data (see the portion (B) of FIG. 12) which follows the strobe point SPB4 of the reproduced clock signal (see the portion (A) of FIG. 12). The trailing edge of the effective charge pulse CB4 (see the portion (F) of FIG. 12) is caused by a strobe point SPB5 of the reproduced clock signal (see the portion (A) of FIG. 12) which immediately follows the moment of the occurrence of the falling edge EB4 in the upper data (see the portion (B) of FIG. 12).

Similarly, effective pulses in the charge signal C2 and the discharge signal D2 are generated in response to the lower data and the reproduced clock signal.

The phase comparators 230 and 232 output the charge signals C1 and C2 to an OR gate 34 (see FIG. 1) in the charge pump circuit 40. The combination of the charge signals C1 and C2 is provided by the OR gate 34. The phase comparators 230 and 232 output the discharge signals D1 and D2 to a NOR gate 36 (see FIG. 1) in the charge pump circuit 40. The inversion of the combination of the discharge signals D1 and D2 is provided by the NOR gate 36.

The combination of the charge signals C1 and C2 is fed from the OR gate 34 to the integrator 38 in the charge pump circuit 40. The inversion of the combination of the discharge signals D1 and D2 is fed from the NOR gate 36 to the integrator 38. During the interval T2 in FIG. 12, the integrator 38 serves to subtract the duration of the effective discharge pulse DB2 (see the portion (G) of FIG. 12) from the sum of the durations of the effective charge pulses CB3 and CB4 (see the portions (E) and (F) of FIG. 12). In the case where a phase error or a frequency error occurs between the reproduced information signal (the upper data and the lower data) and the reproduced clock signal, a difference is present between the duration of the effective discharge pulse DB2 and the sum of the durations of the effective charge pulses CB3 and CB4. The integrator 38 detects such a difference, and outputs a signal representing the detected difference. The difference-representing signal is fed from the integrator 38 to the VCO 44 via the loop filter 42 as a control signal for the VCO 44. The VCO 44 adjusts the phase or the frequency of the reproduced clock signal in response to the control signal to nullify the above-indicated phase error between the reproduced information signal and the reproduced clock signal. During the interval T2 in FIG. 12, the phase adjustment of the reproduced clock signal by the VCO 44 moves a timing of a strobe point in a direction of decreasing the above-indicated difference. As a result, the reproduced clock signal remains in a good synchronized relation or a good timing relation with the reproduced information signal.

Eighth Embodiment

An eighth embodiment of this invention is similar to the embodiment of FIG. 1 except for design changes described hereinafter. The eighth embodiment includes phase comparators 330 and 332 instead of the phase comparators 30 and 32 of FIG. 1 respectively.

The phase comparators 330 and 332 are similar to each other. The phase comparators 330 and 332 receive upper data and lower data from signal detectors 22 and 24 (see FIG. 1) respectively.

Figure 13:
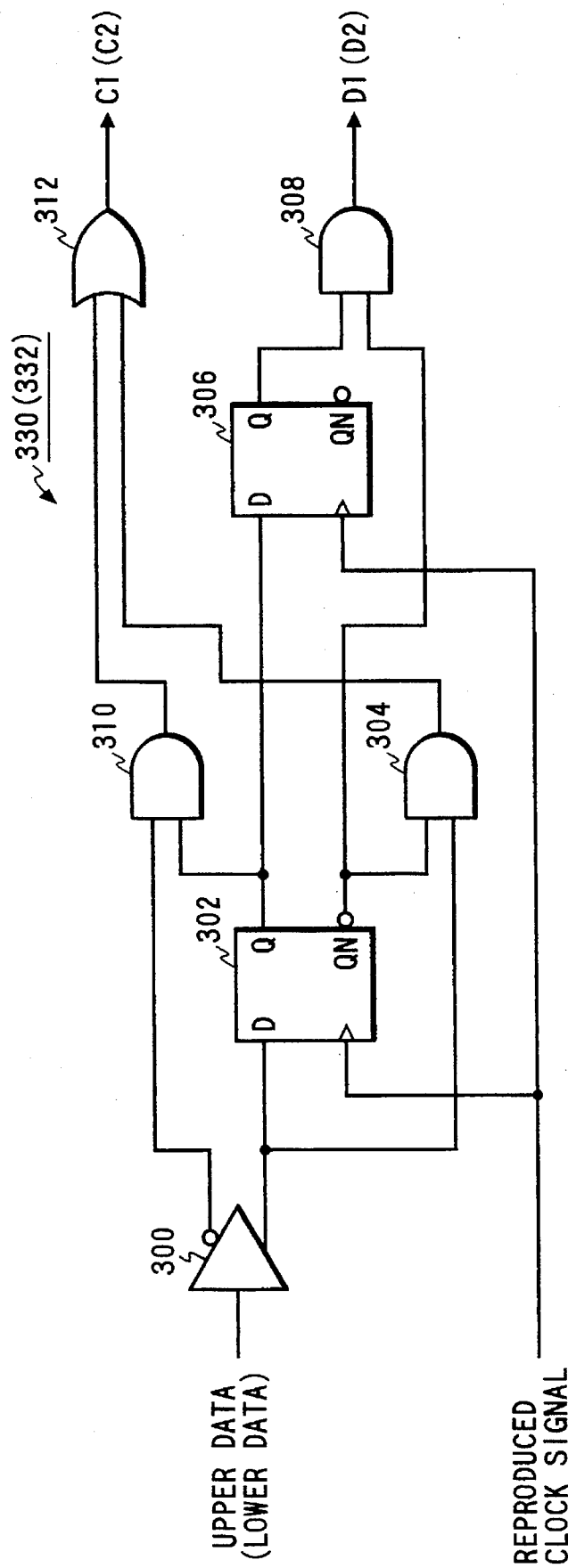
FIG. 13 is a block diagram of a phase comparator according to an eighth embodiment of this invention.

As shown in FIG. 13, the phase comparator 330 (or the phase comparator 332) includes a buffer 300, D-flip-flops 302 and 306, AND gates 304, 308, and 310, and an OR gate 312. The input terminal of the buffer 300 receives the upper data from the signal detector 22 (or the lower data from the signal detector 24). The non-inverting output terminal of the buffer 300 is connected to the D input terminal of the D-flip-flop 302 and a first input terminal of the AND gate 304. The inverting output terminal of the buffer 300 is connected to a first input terminal of the AND gate 310. The non-inverting output terminal Q of the D-flip-flop 302 is connected to a second input terminal of the AND gate 310 and the D input terminal of the D-flip-flop 306. The inverting output terminal QN of the D-flip-flop 302 is connected to a second input terminal of the AND gate 304 and a first input terminal of the AND gate 308. The output terminal of the AND gate 304 leads to a first input terminal of the OR gate 312. The output terminal of the AND gate 310 leads to a second input terminal of the OR gate 312. The OR gate 312 outputs a charge signal C1 or C2 to an OR gate 34 (see FIG. 1) in a charge pump circuit 40. The non-inverting output terminal Q of the D-flip-flop 306 is connected to a second input terminal of the AND gate 308. The AND gate 308 outputs a discharge signal D1 or D2 to a NOR gate 36 (see FIG. 1) in the charge pump circuit 40. The clock input terminals of the D-flip-flop 302 and 306 receive a reproduced clock signal from a VCO 44 (see FIG. 1).

The phase comparators 330 and 332 are similar in operation. Accordingly, only operation of the phase comparator 330 will now be described. The reproduced clock signal applied to the D-flip-flops 302 and 306 has a waveform such as shown in the portion (A) of FIG. 14. The upper data fed from the signal detector 22 (see FIG. 1) to the buffer 300 has a waveform such as shown in the portion (B) of FIG. 14. The upper data passes through the buffer 300, and then reaches the D-flip-flop 302. The upper data is latched by the D-flip-flop 302 at every strobe point of the reproduced clock signal (that is, at every moment of the occurrence of a rising or positive-going edge in the reproduced clock signal). Thus, an output signal of the D-flip-flop 302 which appears at its non-inverting output terminal Q has a waveform such as shown in the portion (C) of FIG. 14. The Q output signal of the D-flip-flop 302 (see the portion (C) of FIG. 14) is latched by the D-flip-flop 306 at every strobe point of the reproduced clock signal (that is, at every moment of the occurrence of a rising or positive-going edge in the reproduced clock signal). Thus, an output signal of the D-flip-flop 306 which appears at its non-inverting output terminal Q has a waveform such as shown in the portion (D) of FIG. 14.

Figure 14:
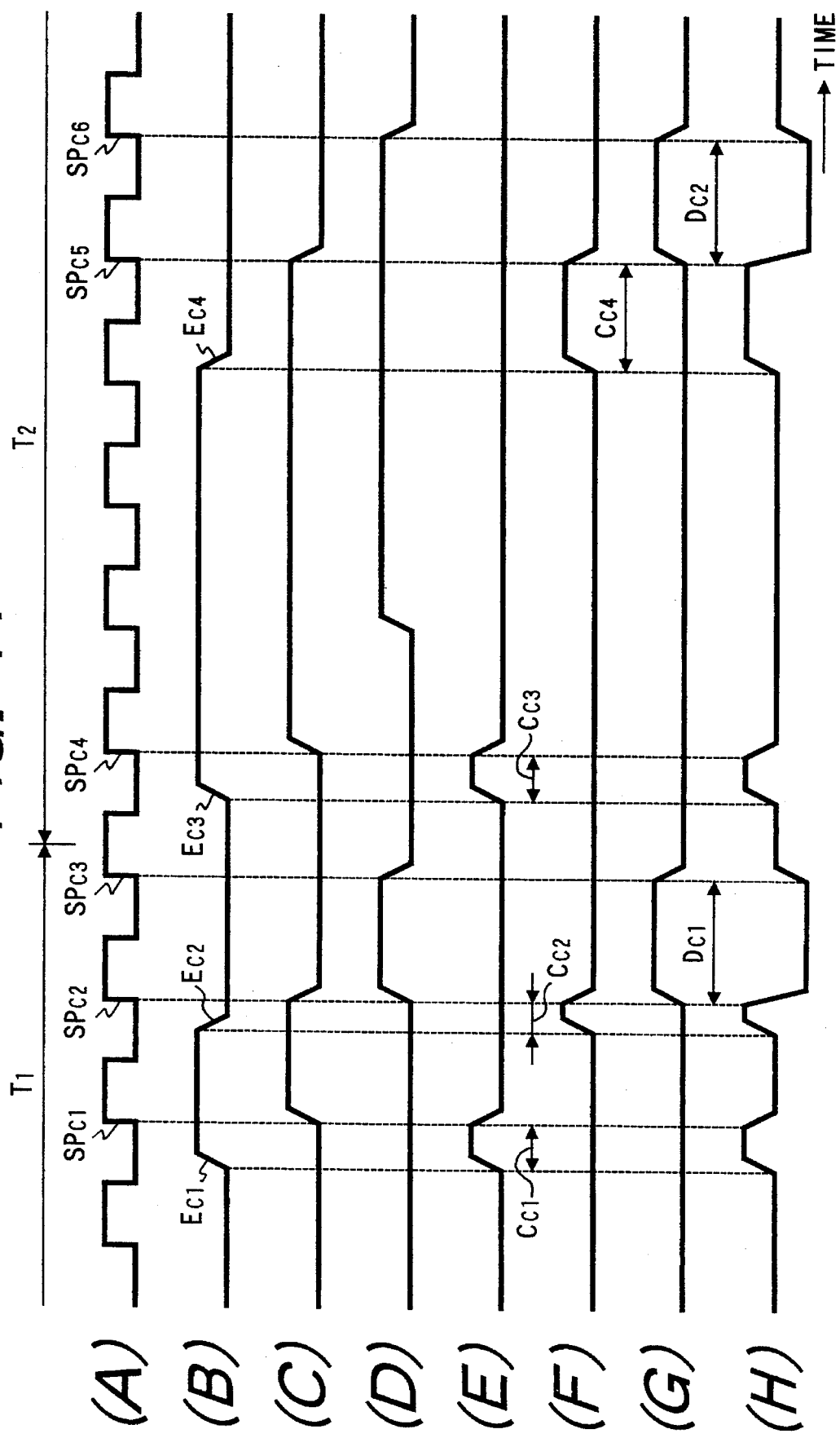
FIG. 14 is a time-domain diagram of signals in the phase comparator of FIG. 13.

The upper data (see the portion (B) of FIG. 14) reaches the AND gate 304 after passing through the buffer 200. An output signal of the D-flip-flop 302 which appears at its inverting output terminal QN is applied to the AND gate 304. The AND gate 304 executes AND operation between the upper data (see the portion (B) of FIG. 14) and the QN output signal of the D-flip-flop 302, thereby generating and outputting a signal which has a waveform such as shown in the portion (E) of FIG. 14. The buffer 300 outputs the inversion of the upper data to the AND gate 310. The Q output signal of the D-flip-flop 302 (see the portion (C) of FIG. 14) is applied to the AND gate 310. The AND gate 310 executes AND operation between the inversion of the upper data and the Q output signal of the D-flip-flop 302 (see the portion (C) of FIG. 14), thereby generating and outputting a signal which has a waveform such as shown in the portion (F) of FIG. 14. The output signal of the AND gate 304 (see the portion (E) of FIG. 14) is applied to the OR gate 312. The output signal of the AND gate 310 (see the portion (F) of FIG. 14) is applied to the OR gate 312. The OR gate 312 executes OR operation between the output signal of the AND gate 304 (see the portion (E) of FIG. 14) and the output signal of the AND gate 310 (see the portion (F) of FIG. 14). The output signal of the OR gate 312 constitutes the charge signal C1. The QN output signal of the D-flip-flop 302 is applied to the AND gate 308. The Q output signal of the D-flip-flop 306 (see the portion (D) of FIG. 14) is applied to the AND gate 308. The AND gate 308 executes AND operation between the QN output signal of the D-flip-flop 302 and the Q output signal of the D-flip-flop 306 (see the portion (D) of FIG. 14), thereby generating and outputting a signal which has a waveform such as shown in the portion (G) of FIG. 14. The output signal of the AND gate 308 constitutes the discharge signal D1.

The phase comparator 332 receives the lower data from the signal detector 24 (see FIG. 1). The phase comparator 332 processes the lower data in response to the reproduced clock signal in a manner similar to the manner of the processing of the upper data by the phase comparator 330. Thereby, the phase comparator 332 generates and outputs the charge signal C2 and the discharge signal D2 in response to the lower data.

In the case where a discharge signal and a charge signal vary as shown in the portions (E), (F), and (G) of FIG. 14, a composite charge/discharge signal applied to an operational amplifier 38A (see FIG. 5) has a waveform such as shown in the portion (H) of FIG. 14.

A consideration will now be given of conditions where effective pulses in the upper data and the lower date are relatively short so that the duration of every effective pulse contains only one strobe point of the reproduced clock signal. An example of these conditions occurs during an interval T1 in FIG. 14. During the interval T1 in FIG. 14, the leading edge of an effective pulse CC1 in the charge signal C1 (see the portion (E) of FIG. 14) is caused by a first rising edge EC1 in the upper data (see the portion (B) of FIG. 14). The trailing edge of the effective charge pulse CC1 (see the portion (E) of FIG. 14) is caused by a strobe point SPC1 of the reproduced clock signal (see the portion (A) of FIG. 14) which immediately follows the moment of the occurrence of the first rising edge EC1 in the upper data (see the portion (B) of FIG. 14). The leading edge of a subsequent effective pulse CC2 in the charge signal C1 (see the portion (F) of FIG. 14) is caused by a first falling edge EC2 in the upper data (see the portion (B) of FIG. 14) which follows the strobe point SPC1 of the reproduced clock signal (see the portion (A) of FIG. 14). The trailing edge of the effective charge pulse CC2 is caused by a strobe point SPC2 of the reproduced clock signal (see the portion (A) of FIG. 14) which immediately follows the moment of the occurrence of the falling edge EC2 in the upper data (see the portion (B) of FIG. 14). On the other hand, the leading edge of an effective pulse DC1 in the discharge signal D1 (see the portion (G) of FIG. 14) is caused by the strobe point SPC2 of the reproduced clock signal (see the portion (A) of FIG. 14). The trailing edge of the effective discharge pulse DC1 see the portion (G) of FIG. 14) is caused by a next strobe point SPC3 of the reproduced clock signal (see the portion (A) of FIG. 14).

Similarly, effective pulses in the charge signal C2 and the discharge signal D2 are generated in response to the lower data and the reproduced clock signal.

The phase comparators 330 and 332 output the charge signals C1 and C2 to an OR gate 34 (see FIG. 1) in the charge pump circuit 40. The combination of the charge signals C1 and C2 is provided by the OR gate 34. The phase comparators 230 and 232 output the discharge signals D1 and D2 to a NOR gate 36 (see FIG. 1) in the charge pump circuit 40. The inversion of the combination of the discharge signals D1 and D2 is provided by the NOR gate 36.

The combination of the charge signals C1 and C2 is fed from the OR gate 34 to the integrator 38 in the charge pump circuit 40. The inversion of the combination of the discharge signals D1 and D2 is fed from the NOR gate 36 to the integrator 38. During the interval T1 in FIG. 14, the integrator 38 serves to subtract the duration of the effective discharge pulse DC1 (see the portion (G) of FIG. 14) from the sum of the durations of the effective charge pulses CC1 and CC2 (see the portions (E) and (F) of FIG. 14). In the case where a phase error or a frequency error occurs between the reproduced information signal (the upper data and the lower data) and the reproduced clock signal, a difference is present between the duration of the effective discharge pulse DC1 and the sum of the durations of the effective charge pulses CC1 and CC2. The integrator 38 detects such a difference, and outputs a signal representing the detected difference. The difference-representing signal is fed from the integrator 38 to the VCO 44 via the loop filter 42 as a control signal for the VCO 44. The VCO 44 adjusts the phase or the frequency of the reproduced clock signal in response to the control signal to nullify the above-indicated phase error between the reproduced information signal and the reproduced clock signal. During the interval T1 in FIG. 14, the phase adjustment of the reproduced clock signal by the VCO 44 moves a timing of a strobe point in a direction of decreasing the above-indicated difference. As a result, the reproduced clock signal remains in a good synchronized relation or a good timing relation with the reproduced information signal.

A consideration will now be given of conditions where effective pulses in the upper data and the lower date are relatively long so that the duration of every effective pulse contains two or more strobe points of the reproduced clock signal. An example of these conditions occurs during an interval T2 in FIG. 14. During the interval T2 in FIG. 14, the leading edge of an effective pulse CC3 in the charge signal C1 (see the portion (E) of FIG. 14) is caused by a rising edge EC3 in the upper data (see the portion (B) of FIG. 14). The trailing edge of the effective charge pulse CC3 (see the portion (E) of FIG. 14) is caused by a strobe point SPC4 of the reproduced clock signal (see the portion (A) of FIG. 14) which immediately follows the moment of the occurrence of the rising edge EC3 in the upper data (see the portion (B) of FIG. 14). The leading edge of a subsequent effective pulse CC4 in the charge signal C1 (see the portion (F) of FIG. 14) is caused by a falling edge EC4 in the upper data (see the portion (B) of FIG. 14)which-follows the strobe point SPC4. The trailing edge of the effective charge pulse CC4 (see the portion (F) of FIG. 14) is caused by a strobe point SPC5 of the upper data (see the portion (B) of FIG. 14) which immediately follows the moment of the occurrence of the falling edge EC4 in the upper data (see the portion (B) of FIG. 14). On the other hand, the leading edge of an effective pulse DC2 in the discharge signal D1 (see the portion (G) of FIG. 14) is caused by the strobe point SPC5 of the reproduced clock signal (see the portion (A) of FIG. 14). The trailing edge of the effective discharge pulse DC2 (see the portion (G) of FIG. 14) is caused by a subsequent strobe point SPC6 of the reproduced clock signal (see the portion (A) of FIG. 14).

Similarly, effective pulses in the charge signal C2 and the discharge signal D2 are generated in response to the lower data and the reproduced clock signal.

The phase comparators 330 and 332 output the charge signals C1 and C2 to an OR gate 34 (see FIG. 1) in the charge pump circuit 40. The combination of the charge signals C1 and C2 is provided by the OR gate 34. The phase comparators 330 and 332 output the discharge signals D1 and D2 to a NOR gate 36 (see FIG. 1) in the charge pump circuit 40. The inversion of the combination of the discharge signals D1 and D2 is provided by the NOR gate 36.

The combination of the charge signals C1 and C2 is fed from the OR gate 34 to the integrator 38 in the charge pump circuit 40. The inversion of the combination of the discharge signals D1 and D2 is fed from the NOR gate 36 to the integrator 38. During the interval T2 in FIG. 14, the integrator 38 serves to subtract the duration of the effective discharge pulse DC2 (see the portion (G) of FIG. 14) from the sum of the durations of the effective charge pulses CC3 and CC4 (see the portions (E) and (F) of FIG. 14). In the case where a phase error or a frequency error occurs between the reproduced information signal (the upper data and the lower data) and the reproduced clock signal, a difference is present between the duration of the effective discharge pulse DC2 and the sum of the durations of the effective charge pulses CC3 and CC4. The integrator 38 detects such a difference, and outputs a signal representing the detected difference. The difference-representing signal is fed from the integrator 38 to the VCO 44 via the loop filter 42 as a control signal for the VCO 44. The VCO 44 adjusts the phase or the frequency of the reproduced clock signal in response to the control signal to nullify the above-indicated phase error between the reproduced information signal and the reproduced clock signal. During the interval T2 in FIG. 14, the phase adjustment of the reproduced clock signal by the VCO 44 moves a timing of a strobe point in a direction of decreasing the above-indicated difference. As a result, the reproduced clock signal remains in a good synchronized relation or a good timing relation with the reproduced information signal.

What is claimed is:

1. A phase comparing circuit comprising:

first means for generating a detection signal in response to a multi-level signal, the detection signal representing whether or not the multi-level signal is in a given level;

second means connected to the first means for generating a first control signal in response to the detection signal generated by the first means and a clock signal, the first control signal representing a time interval between a leading edge of a pulse in the detection signal and a strobe point of the clock signal which immediately follows the leading edge of the pulse in the detection signal;

third means connected to the first means for generating a second control signal in response to the detection signal generated by the first means and the clock signal, the second control signal representing a time interval between the strobe point of the clock signal and a trailing edge of the pulse in the detection signal; and fourth means connected to the second means and the third means for generating a phase error signal in response to the first control signal generated by the second means and the second control signal generated by the third means, the phase error signal representing a difference between a phase of the detection signal generated by the first means and a phase of the clock signal.

2. The phase comparing circuit of claim 1, wherein the fourth means comprises a charge pump circuit.

3. A phase comparing circuit comprising:

first means for generating a detection signal in response to a multi-level signal, the detection signal representing whether or not the multi-level signal is in a given level;

second means connected to the first means for generating a first control signal in response to the detection signal generated by the first means and a clock signal, the first control signal representing a time interval between a leading edge of a pulse in the detection signal and a first strobe point of the clock signal which immediately follows the leading edge of the pulse in the detection signal;

third means for generating a second control signal in response to the clock signal, the second control signal representing a time interval between the first strobe point of the clock signal and a second strobe point of the clock signal which immediately follows the first strobe point of the clock signal;

fourth means for generating a third control signal in response to the clock signal, the third control signal representing a time interval being equal to a half of a period of the clock signal and starting from the second strobe point of the clock signal; and fifth means connected to the second means, the third means, and the fourth means for generating a phase error signal in response to the first control signal generated by the second means, the second control signal generated by the third means, and the third control signal generated by the fourth means, the phase error signal representing a difference between a phase of the detection signal generated by the first means and a phase of the clock signal.

4. The phase comparing circuit of claim 3, wherein the first means comprises a plurality of signal detectors generating different detection signals in response to the multi-level signal respectively, the detection signals representing whether or not the multi-level signal is in different given levels respectively, and wherein the second means is responsive to the detection signals generated by the signal detectors.

5. The phase comparing circuit of claim 3, wherein the fifth means comprises a charge pump circuit.

6. A Phase locked loop circuit comprising the phase comparing circuit of claim 3.

7. A phase comparing circuit comprising:

first means for generating a detection signal in response to a multi-level signal, the detection signal representing whether or not the multi-level signal is in a given level;

second means connected to the first means for generating a first control signal in response to the detection signal generated by the first means and a clock signal, the first control signal representing a time interval between a leading edge of a pulse in the detection signal and a first strobe point of the clock signal which immediately follows the leading edge of the pulse in the detection signal;

third means connected to the first means for generating a second control signal in response to the detection signal generated by the first means and the clock signal in cases where a trailing edge of the pulse in the detection signal precedes a second strobe point of the clock signal which immediately follows the first strobe point of the clock signal, and for generating a third control signal and a fourth control signal in response to the clock signal in cases where the second strobe point of the clock signal precedes the trailing edge of the pulse in the detection signal, the second control signal representing a time interval between the first strobe point of the clock signal and the trailing edge of the pulse in the detection signal, the third control signal representing a time interval between the first strobe point of the clock signal and the second strobe point of the clock signal, the fourth control signal representing a time interval equal to a half of a period of the clock signal which starts from the second strobe point of the clock signal; and fourth means connected to the second means and the third means for generating a phase error signal in response to the first control signal generated by the second means and the second control signal generated by the third means or in response to the first control signal generated by the second means and the third and fourth control signals generated by the third means, the phase error signal representing a difference between a phase of the detection signal generated by the first means and a phase of the clock signal.

8. The phase comparing circuit of claim 7, wherein the first means comprises a plurality of signal detectors generating different detection signals in response to the multi-level signal respectively, the detection signals representing whether or not the multi-level signal is in different given levels respectively, and wherein the second means and the third means are responsive to the detection signals generated by the signal detectors.

9. The phase comparing circuit of claim 7, wherein the fourth means comprises a charge pump circuit.

10. A Phase locked loop circuit comprising the phase comparing circuit of claim 7.

11. A phase comparing circuit comprising:

a) a plurality of signal detectors generating different detection signals in response to a multi-level signal respectively, the detection signals representing whether or not the multi-level signal is in different given levels respectively; and b) a plurality of phase comparing sections following the signal detectors respectively and processing the detection signals generated by the signal detectors respectively;

wherein each of the phase comparing sections comprises:

b1) first means for generating a first control signal in response to the related detection signal, the first control signal representing a time interval between a leading edge of a pulse in the detection signal and a strobe point of a clock signal which immediately follows the leading edge of the pulse in the detection signal;

b2) second means for generating a second control signal in response to the related detection signal, the second control signal representing a time interval between the strobe point of the clock signal and a trailing edge of the pulse in the detection signal; and b3) third means connected to the first means and the second means for generating a phase error signal in response to the first control signal generated by the first means and the second control signal generated by the second means, the phase error signal representing a difference between a phase of the detection signal generated by the first means and a phase of the clock signal.

12. A Phase locked loop circuit comprising:

first means for generating a clock signal;

second means connected to the first means for generating a first control signal in response to an input signal and the clock signal generated by the first means, the first control signal representing a time interval between a leading edge of a pulse in the input signal and a strobe point of the clock signal which immediately follows the leading edge of the pulse in the input signal;

third means connected to the first means for generating a second control signal in response to the clock signal generated by the first means and the input signal, the second control signal representing a time interval between the strobe point of the clock signal and a trailing edge of the pulse in the input signal;

fourth means connected to the second means and the third means for generating a phase error signal in response to the first control signal generated by the second means and the second control signal generated by the third means, the phase error signal representing a difference between a phase of the clock signal generated by the first means and a phase of the input signal; and fifth means for controlling the phase of the clock signal in response to the phase error signal generated by the fourth means.

13. A phase comparing circuit comprising:

first means for generating a detection signal in response to a multi-level signal, the detection signal representing whether or not the multi-level signal is in a given level;

second means connected to the first means for generating a first control signal in response to the detection signal generated by the first means and a clock signal, the first control signal representing a time interval between a leading edge of a pulse in the detection signal and a first strobe point of the clock signal which immediately follows the leading edge of the pulse in the detection signal;

third means connected to the first means for generating a second control signal in response to the detection signal generated by the first means and the clock signal in cases where a trailing edge of the pulse in the detection signal precedes a second strobe point of the clock signal which immediately follows the first strobe point of the clock signal, and for generating a third control signal and a fourth control signal in response to the detection signal generated by the first means and the clock signal in cases where the second strobe point of the clock signal precedes the trailing edge of the pulse in the detection signal, the second control signal representing a time interval between the first strobe point of the clock signal and the trailing edge of the pulse in the detection signal, the third control signal representing a time interval between the first strobe point of the clock signal and the second strobe point of the clock signal, the fourth control signal representing a time interval between the trailing edge of the pulse in the detection signal and a third strobe point of the clock signal which immediately follows the trailing edge of the pulse in the detection signal; and fourth means connected to the second means and the third means for generating a phase error signal in response to the first control signal generated by the second means and one of (1) the second control signal generated by the third means and (2) a combination of the third and fourth control signals generated by the third means, the phase error signal representing a difference between a phase of the detection signal generated by the first means and a phase of the clock signal.

14. The phase comparing circuit of claim 13, wherein the first means comprises a plurality of signal detectors generating different detection signals in response to the multi-level signal respectively, the detection signals representing whether or not the multi-level signal is in different given levels respectively, and wherein the second means and the third means are responsive to the detection signals generated by the signal detectors.

15. The phase comparing circuit of claim 13, wherein the fourth means comprises a charge pump circuit.

16. A Phase locked loop circuit comprising the phase comparing circuit of claim 13.

17. A phase comparing circuit comprising:

first means for generating a detection signal in response to a multi-level signal, the detection signal representing whether or not the multi-level signal is in a given level;

second means connected to the first means for generating a first control signal in response to the detection signal generated by the first means and a clock signal, the first control signal representing a time interval between a leading edge of a pulse in the detection signal and a first strobe point of the clock signal which immediately follows the leading edge of the pulse in the detection signal;

third means connected to the first means for generating a second control signal in response to the detection signal generated by the first means and the clock signal, the second control signal representing a time interval between a trailing edge of the pulse in the detection signal and a second strobe point of the clock signal which immediately follows the trailing edge of the pulse in the detection signal;

fourth means for generating a third control signal in response to the clock signal, the third control signal representing a time interval equal to a period of the clock signal; and fifth means connected to the second means, the third means, and the fourth means for generating a phase error signal in response to the first control signal generated by the second means, the second control signal generated by the third means, and the third control signal generated by the fourth means, the phase error signal representing a difference between a phase of the detection signal generated by the first means and a phase of the clock signal.

18. The phase comparing circuit of claim 17, wherein the first means comprises a plurality of signal detectors generating different detection signals in response to the multi-level signal respectively, the detection signals representing whether or not the multi-level signal is in different given levels respectively, and wherein the second means and the third means are responsive to the detection signals generated by the signal detectors.

19. The phase comparing circuit of claim 17, wherein the fifth means comprises a charge pump circuit.

20. A Phase locked loop circuit comprising the phase comparing circuit of claim 17.

* * * * *